United States Patent
Kim et al.

(10) Patent No.: US 8,796,597 B2
(45) Date of Patent: Aug. 5, 2014

(54) IN-LINE PACKAGE APPARATUSES AND METHODS

(75) Inventors: Min-Ill Kim, Cheonan-si (KR); Jong-Gi Lee, Yongin-si (KR); Kwang-Yong Lee, Anyang-si (KR); Ki-Kwon Jeong, Cheonan-si (KR)

(73) Assignee: SAMSUNG Electronics Co., Ltd., Suwon-si (KR)

(*) Notice: Subject to any disclaimer, the term of this patent is extended or adjusted under 35 U.S.C. 154(b) by 1081 days.

(21) Appl. No.: 12/272,867

(22) Filed: Nov. 18, 2008

(65) Prior Publication Data

US 2009/0127314 A1 May 21, 2009

(30) Foreign Application Priority Data

Nov. 19, 2007 (KR) .................. 10-2007-0117966

(51) Int. Cl.
| | |
|---|---|
| B23K 1/002 | (2006.01) |
| B23K 1/00 | (2006.01) |
| B23K 5/00 | (2006.01) |
| B23K 20/14 | (2006.01) |
| B23K 37/04 | (2006.01) |
| H05B 6/04 | (2006.01) |

(52) U.S. Cl.
USPC ............. 219/616; 219/660; 228/43; 228/49.5

(58) Field of Classification Search
USPC ........... 219/660, 662, 444.1, 612–617, 85.21, 219/85.22, 85.1, 85.12, 85.16–85.18; 228/180.22, 43, 49.5
See application file for complete search history.

(56) References Cited

U.S. PATENT DOCUMENTS

| | | | | |
|---|---|---|---|---|
| 5,208,528 | A | * | 5/1993 | Quintard .................. 324/750.03 |
| 5,816,482 | A | * | 10/1998 | Grabbe .......................... 228/212 |
| 6,413,850 | B1 | * | 7/2002 | Ooroku et al. ................ 438/613 |
| 6,607,117 | B1 | * | 8/2003 | Kang et al. .................... 228/103 |

(Continued)

FOREIGN PATENT DOCUMENTS

| | | |
|---|---|---|
| CN | 1822340 A | 8/2006 |
| JP | 03-164040 | 7/1991 |

(Continued)

OTHER PUBLICATIONS

Korean Office Action dated Mar. 26, 2014 issued in KR Application No. 10-2007-0117966.

*Primary Examiner* — Henry Yuen
*Assistant Examiner* — Hemant Mathew
(74) *Attorney, Agent, or Firm* — Stanzione & Kim, LLP

(57) ABSTRACT

An in-line package apparatus includes a first treating unit, an input storage unit, a heating unit and an output storage unit. The first treating unit performs a ball attach process or a chip mount process. A processing object that a process is completed in the first treating unit is received in a magazine so as to be vertically stacked and a plurality of magazines each having one or more processing objects is stored in an input stacker. The heating unit performs a reflow process on the processing objects in the magazine stored in the input stacker by an induction heating method. A processing object that a reflow process is completed is received in a magazine and then stored in an output stacker.

22 Claims, 25 Drawing Sheets

(56) References Cited

U.S. PATENT DOCUMENTS

| | | |
|---|---|---|
| 6,608,291 B1 * | 8/2003 | Collins et al. ............... 219/662 |
| 6,609,652 B2 * | 8/2003 | MacKay et al. ............. 228/254 |
| 6,687,132 B2 * | 2/2004 | Orcutt et al. ................ 361/760 |
| 6,841,728 B2 * | 1/2005 | Jones et al. .................. 136/244 |
| 6,974,069 B2 * | 12/2005 | Kang et al. .................. 228/103 |
| 7,084,655 B2 * | 8/2006 | Min et al. ................ 324/750.05 |
| 7,357,288 B2 * | 4/2008 | Hosotani et al. ............. 228/6.2 |
| 2003/0213832 A1 | 11/2003 | Kang et al. |
| 2004/0003882 A1 * | 1/2004 | Davis et al. .................... 156/64 |
| 2005/0186019 A1 | 8/2005 | Liu et al. |
| 2009/0099678 A1 | 4/2009 | Kurata et al. |

FOREIGN PATENT DOCUMENTS

| | | |
|---|---|---|
| JP | 06-275666 | 9/1994 |
| JP | 06-338698 | 12/1994 |
| JP | 08-153965 | 6/1996 |
| JP | 2000260826 | 9/2000 |
| JP | 2001-168514 | 6/2001 |
| JP | 2005150142 | 6/2005 |
| JP | 2005-244228 | 9/2005 |
| JP | 2007-053340 | 3/2007 |
| KR | 2001-0037295 | 5/2001 |
| KR | 20040067048 | 7/2004 |

* cited by examiner

IN-LINE PACKAGE APPARATUSES AND METHODS

CROSS-REFERENCE TO RELATED APPLICATIONS

This U.S. non-provisional patent application claims priority under 35 U.S.C. §119 of Korean Patent Application No. 10-2007-0117966, filed Nov. 19, 2007, the entire contents of which are hereby incorporated by reference.

BACKGROUND OF THE INVENTION

1. Field of the Invention

The present general inventive concept relates to apparatuses and methods of manufacturing a semiconductor, and more particularly, to in-line package apparatuses and methods.

2. Description of the Related Art

Semiconductor packaging includes an assembling process providing and assembling solder balls that function as terminals for electrically connecting a semiconductor chip to the outside, and a mounting process mounting the semiconductor chip provided with the solder balls to a printed circuit board (PCB). Both the assembly process and the mounting process require performing a reflow process of the solder balls through applying heat thereto.

SUMMARY OF THE INVENTION

The present general inventive concept provides an apparatus and method to manufacture one or more semiconductor chips or one or more semiconductor chip packages.

Additional aspects and utilities of the present general inventive concept will be set forth in part in the description which follows and, in part, will be obvious from the description, or may be learned by practice of the general inventive concept The foregoing and/or other aspects and utilities of the present general inventive concept may be achieved by providing an in-line package apparatus, including a first treating unit, a heating unit to heat one or more processing objects so as to perform a reflow process of a solder ball of the processing objects treated in the first treating unit, an input storage unit disposed between the first treating unit and the heating unit to store the processing objects treated in the first treating unit, and a moving unit to transfer the processing objects stored in the input storage unit to the heating unit. The input storage unit may include magazines each having slots formed so that the processing objects are stacked to be separated from each other, and an input port disposed to be adjacent to the first treating unit to support the magazine while the processing objects that a treating process is completed in the first treating unit are inserted into the magazine.

The foregoing and/or other aspects and utilities of the present general inventive concept may also be achieved by providing a method of packaging a semiconductor, the method including providing a first treating unit, an input port, an input stacker and a heating unit to be sequentially disposed to perform a reflow process of a solder ball treated in the first treating unit. The processing object treated in the first treating unit may be inserted so as to be stacked in the magazine provided in the input port, the magazine into which all the processing objects are inserted is stored in the input stacker, and the processing object stored in the input stacker may be transferred to the heating unit and heated using an induction heating method.

The foregoing and/or other aspects and utilities of the present general inventive concept may also be achieved by providing a packaging apparatus including a first treating unit having a first number of treating units each to prepare a plurality of processing objects, an input storage unit having a second number of magazines each to receive the plurality of processing objects from corresponding treating units, and a heating unit to receive at least one of the plurality of processing objects from the corresponding ones of the first number of the treating units and to simultaneously perform a reflow process on the receive processing objects.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE EMBODIMENTS

Figure 1:
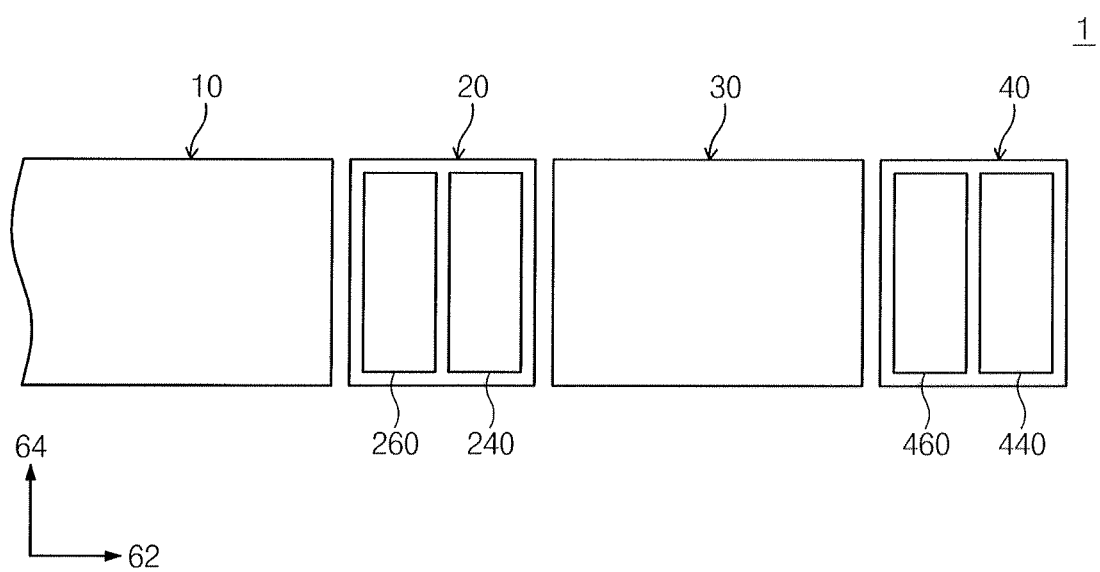
FIG. 1 is a view schematically illustrating a packaging apparatus according to an embodiment of the present apparatus.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 1 is a schematic view illustrating an apparatus, for example, a package apparatus 1 according to an embodiment of the present general inventive concept. The package apparatus 1 performs a reflow process of a solder ball and processes before the reflow process (or a reflow soldering process) using an in-line method. For example, the package apparatus (1 can perform a chip mounting process which mounts a semiconductor chip on a printed-circuit board and a reflow process of a solder ball using an in-line method, or a ball attaching process which attaches a solder ball to a semiconductor chip and a reflow process of a solder ball using an in-line method.

Referring to FIG. 1, the package apparatus 1 includes a first treating unit 10, an input storage unit 20, a heating unit 30, and an output storage unit 40. The packaging apparatus 1 may further include a moving unit 50 as illustrated in FIG. 22. The first treating unit 10 performs a predetermined process to provide a processing object, and the heating unit 30 performs the reflow process of a solder ball of the processing object which has been treated, prepared, and/or provided in the first treating unit 10. The input storage unit 20 stores one or more processing objects which have been treated or prepared in the first treating unit 10 before the processing objects are moved to the heating unit 30 one by one or in a group, and the output storage unit 40 stores one or more processing object after reflow process. The moving unit 50 moves one or more processing objects in the input storage unit 20 to the heating unit 30 and moves the processing objects, on which the reflow process has been performed or completed, to the output storage unit 40. The first treating unit 10, the input storage unit 20, the heating unit 30 and the output storage unit 40 are sequentially arranged in a line. A direction that the first treating unit 10, the input storage unit 20, the heating unit 30 and the output storage unit 40 are arranged is referred to as a first direction 62 and a direction which is perpendicular to the first direction 62 on a horizontal plane is referred to as a second direction 64. A direction which is perpendicular to a horizontal plane which is formed by the first and second direction 62 and 64 is referred to as a third direction 66. Here, the horizontal plane may be a plane where the processing object is disposed in at least one of the first treating unit 10, the input storage unit 20, the heating unit 30, and the output storage unit 40.

Figure 2:
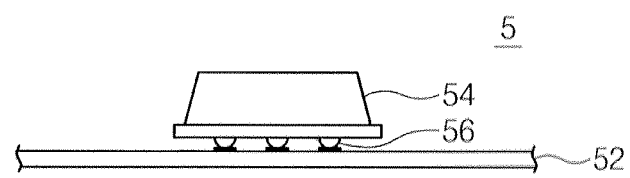
FIGS. 2 and 3 are exemplary diagrams respectively illustrating processing objects provided to a reflow apparatus according to the present general inventive concept.

According to an embodiment, the first treating unit 10 includes a chip mounting unit (not illustrated in FIG. 2) which mounts a semiconductor chip 54 with solder balls 56 on a printed circuit board 52. A processing object 5 which is provided to the heating unit 30 may be the printed circuit board 52 on which the semiconductor chip 54 is mounted as illustrated in FIG. 2. A printer (not illustrated in FIG. 2) may be further provided to the first treating unit 10 to apply a soldering paste (or solder cream) to the printed circuit board 52.

Figure 3:
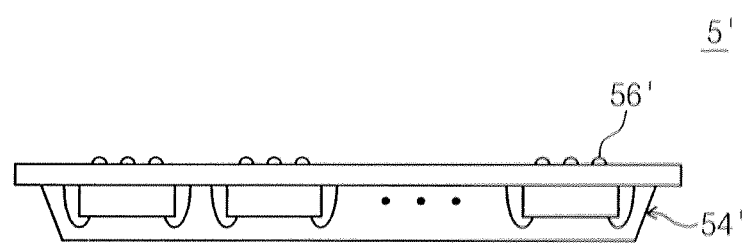
Figure 4:
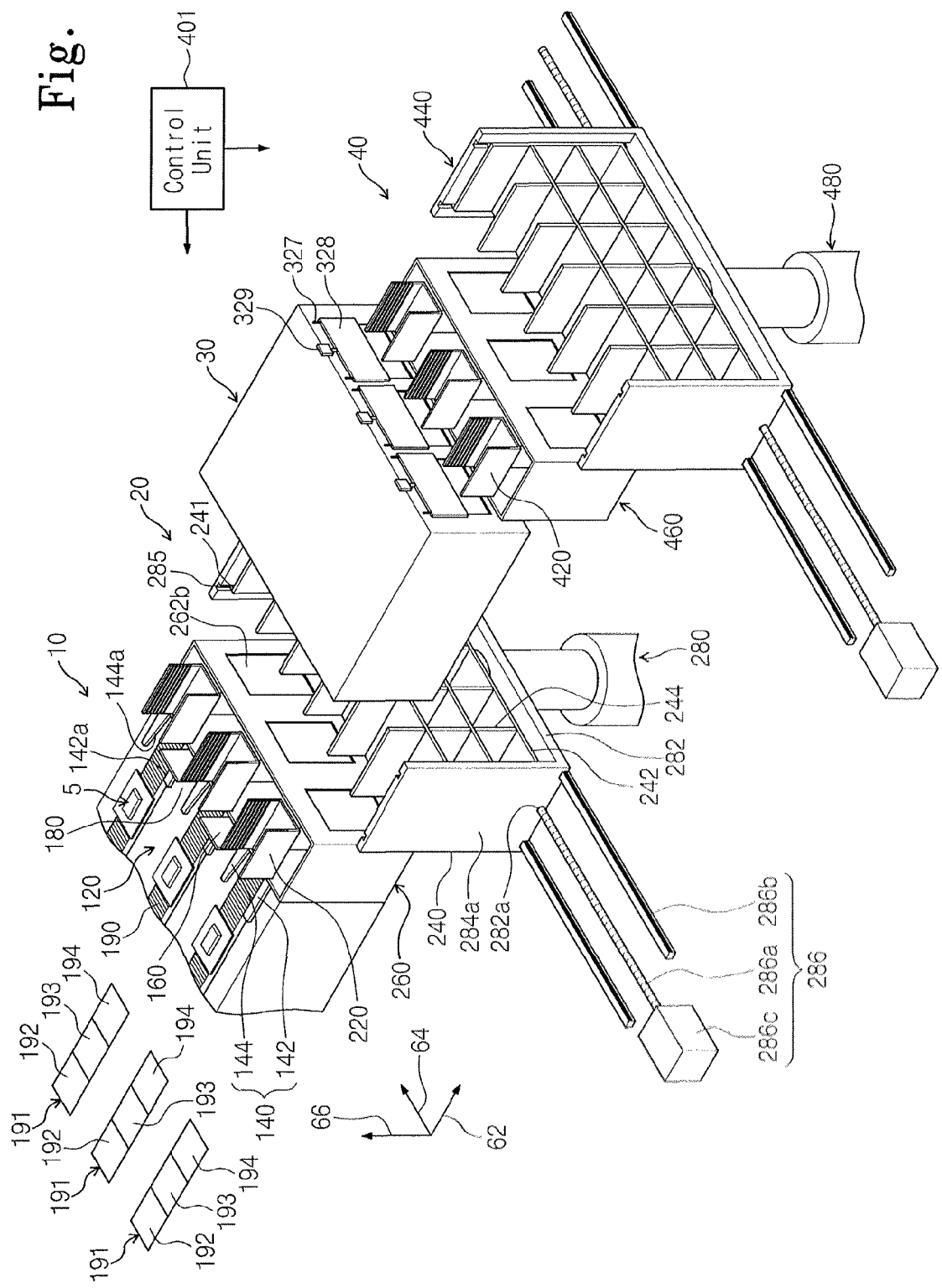
FIG. 4 is a perspective view illustrating the packaging apparatus of FIG. 1.

The first treating unit 10 may include a ball attach unit 192 of FIG. 4 which attaches a solder ball 56' to a semiconductor chip 54', and a processing object 5' which is provided to a heating unit 30 may be the semiconductor chip 54' having the solder ball 56' attached thereto as illustrated in FIG. 3, to form the processing object. A fluxing unit 193 of FIG. 4 may be further provided to the first treating unit 10 to provide a flux to a semiconductor chip 54, to form the processing object. The processing object 5' may be one chip or a plurality of chips which are not divided. The processing object 5' may be various kinds of components having an external terminal which needs a reflow process such as a solder ball.

The first treating unit 10 may include a chip mounting unit 194 of FIG. 4 to mount a semiconductor chip 54 on a printed circuit board 52 to form the processing object.

As described above, the first treating unit 10 includes a first number of treating units 191 each to form and prepare the processing objects from each of the treating units. Each treating unit 191 may include the ball attaching unit 192, the fluxing unit 193, and the chip mounting unit 194 to provide the processing objects.

FIG. 4 is a perspective view illustrating a first treating unit 10, an input storage unit 20, a heating unit 30 and an output storage unit 40 of the packaging apparatus 1 of FIG. 1. The first treating unit 10 includes a base 120, an arranging member 140 and a cutoff plate 160. The cutoff plate 160 upwardly protrudes from an edge of the base 120. The cutoff plates 160 are disposed to be separated from each other to form a space between adjacent cutoff plate 160 to function as an exit 180 to which a processing object 5 is outputted from the first treating unit 10. The number of the exit 180 may be at least one. In the present embodiment, three exits are provided. The processing object 5 is moved from the first treating unit 10 to the input storage unit 20 along the first direction 62 by a transferring unit such as a conveyer belt 190.

The arranging member 140 is disposed on an edge of the base 120. The arranging member 140 arranges a location of a processing object 5 so that the processing object 5 moving along an upper surface of the base 120 moves through the exit 180. The arranging member 140 includes a first arranging member 142 and a second arranging member 144 disposed separated from each other. The first arranging member 142 and the second arranging member 144 are separated from each other along the second direction 64. An inner side 142a of the first arranging member 142 is parallel to the first direction 62 and an inner side 144a of the second arranging member 144 inclines toward the first direction 62 so that a distance between the first arranging member 142 and the inner side 144a of the second arranging member 144 varies, that is, the distance becomes great as the inner side 144a of the second arranging member 144 becomes distant from the cutoff plate 160. When a location of the processing object 5 is sheered, the processing object 5 is arranged from the sheered location to move moves along the inner side 144a of the second arranging member 144. The first and second arranging members 142 and 144 have a plate shape and may be fixedly installed on the base 120. However, it is possible that the first arranging member 142 has a plate shape and may be fixedly installed on the base 120, and the second arranging member 144 has a shape of a conical roller and may be movably installed on the base 120 so that the second arranging member 144 can rotate with respect to a central axis as a rotating axis parallel to the third direction 66.

A processing object 5 outputted from the first treating unit 10 through an exit 180 of the base 120 is stored in the input storage unit 20. The input storage unit 20 includes a magazine 220, an input stacker 240, an input port 260 and a stacker moving unit 280. A plurality of processing objects 5 are received in the magazine 220 and a plurality of the magazines 220 are stored in the input stacker 240. As will be described later, in the present embodiment, the heating unit 30 performs a reflow process using an induction heating method. A time taken to perform and complete a reflow process is very short and a reflow process speed is very fast, compared with a time taken to perform and complete a chip mounting process or a ball attaching process. Thus, even though the heating unit 30 rapidly performs a process, the processing objects 5 can be continuously provided into the heating unit 30 because a plurality of the processing objects 5 are provided to the heating unit 30 in a state that the plurality of the processing objects 5 are disposed in the input storage unit 20 until the processing objects 5 can be transferred to the heating unit 30.

Figure 5:
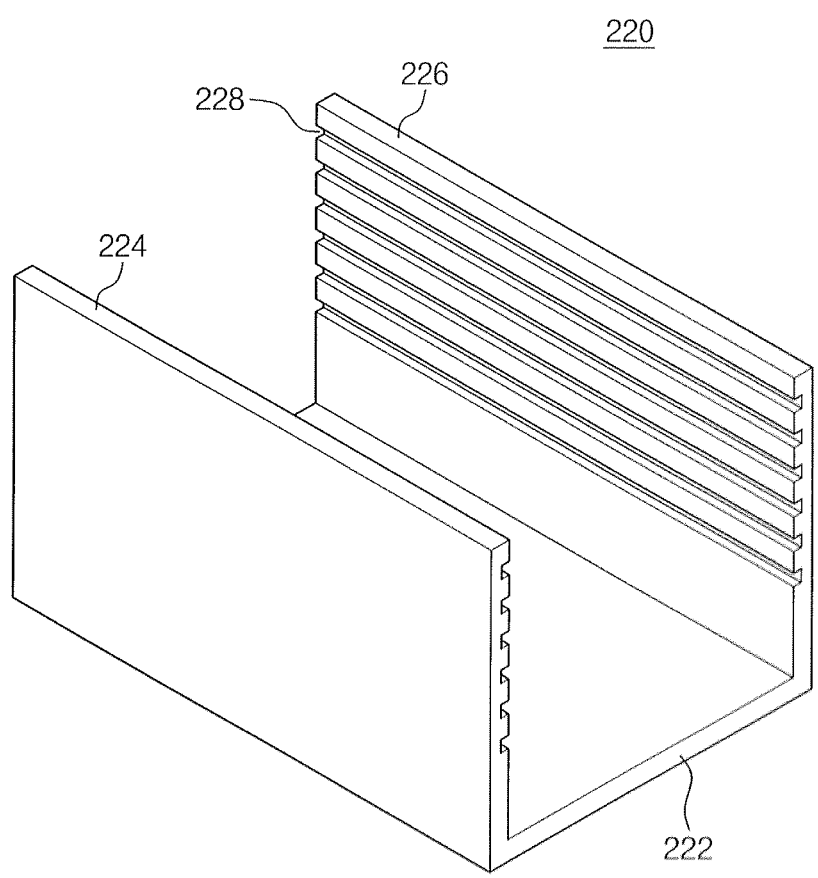
FIG. 5 is a perspective view illustrating an example of a magazine of the packaging apparatus of FIG. 1.

FIG. 5 is a perspective view illustrating an example of a magazine 220 of FIG. 4. The magazine 220 includes a floor plate 222 and two side plates 224 and 226. The side plates 224 and 226 extend upward from either side of the floor plate 222. The side plates 224 and 226 have the same shape. The front, rear, and top sides of the magazine 220 are open. The open front and rear sides of the magazine 220 are provided such that the processing objects 5 are inserted into or withdrawn out from the magazine 220 through the open front and rear sides thereof, and the space defined between the floor plate 222 and the side plates 224 and 226 is provided to store the processing objects 5. Slots 228 are defined into the inner surfaces of each of the side plates 224 and 226, in which edge regions of the processing objects 5 are inserted. The slots 228 are provided extending from one end to the other end of the inner surfaces of the side plates 224 and 226. The slots 228 are provided in plural, respectively separated in a vertical direction, that is, the third direction 66, from one another. The objects 5 are stored in the magazine 220 in a stacked configuration, separated from each other since the processing units are inserted into the corresponding slots 228 of the side plate 224 and 226 through the front and rear sides.

Figure 6:
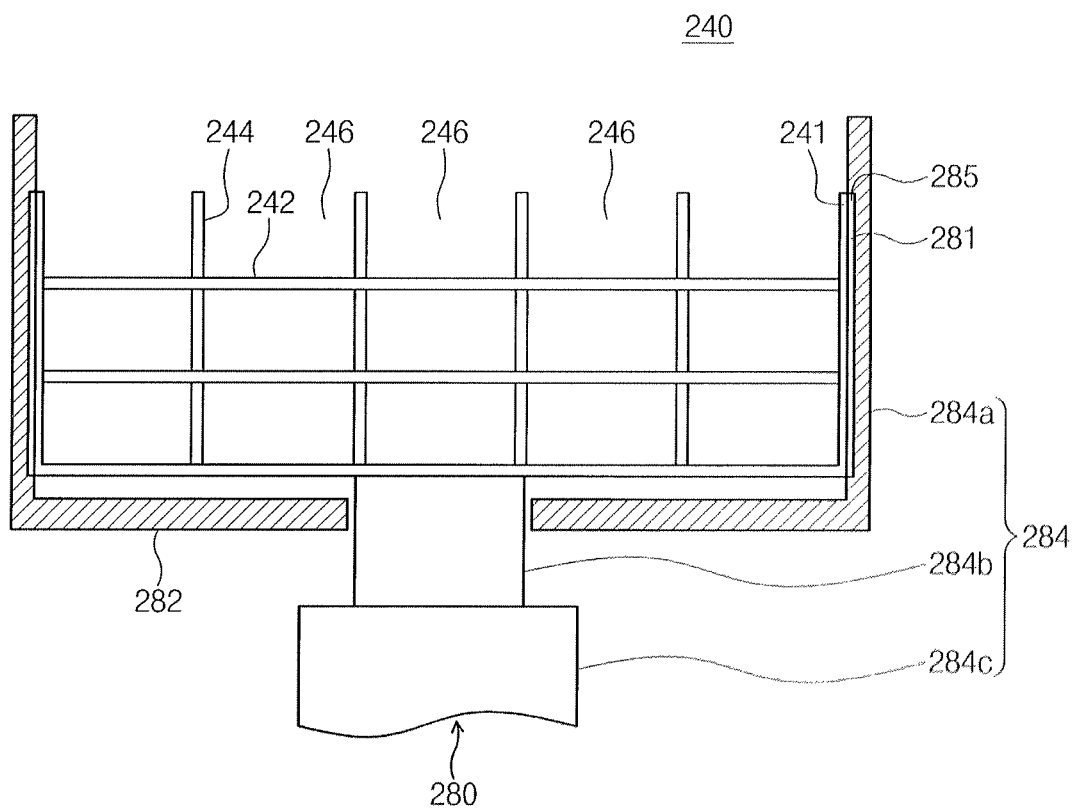
FIG. 6 is a sectional view illustrating an input stacker of the packaging apparatus of FIG. 1.

FIG. 6 is a cross sectional view illustrating the input stacker 240 to receive a plurality of the magazines 220. Referring to FIGS. 4 and 6, the input stacker 240 has a plurality of storage spaces 246 to store the corresponding magazines 220. The input stacker 240 includes a plurality of horizontal plates 242 and a plurality of vertical plates 244. The horizontal plates 242 function as floors on which the corresponding magazines 220 are seated or disposed. The vertical plates 242 are arranged in the third direction 66 to be disposed at predetermined intervals along the second direction 64. The vertical plates 244 partition the spaces defined between the horizontal plates 242 into a plurality of spaces. The vertical plates 244 are separated at predetermined intervals from one another along the second direction 64. The horizontal plates 242 and the vertical plates 244 may be integrally formed or fixed and coupled to one another to form the above-described storage spaces. In the above-configuration, the plurality of storage spaces 246 is provided in the input stacker 240 along both the second direction 64 and the third direction 66. Each storage space 246 is enclosed by two vertical plates 244 and two horizontal plates 242, and sides at the front and rear of the storage space 246 are open. The front and rear sides of the storage space 246 function as passages through which the magazine 220 is transferred to enter into or exit from the storage space 246. The top of the uppermost storage spaces may be open. One magazine 220 is stored in each storage space 246. However, it is possible that a plurality of magazines 220 may be stored in each storage space 246 along the first direction 62.

Figure 7:
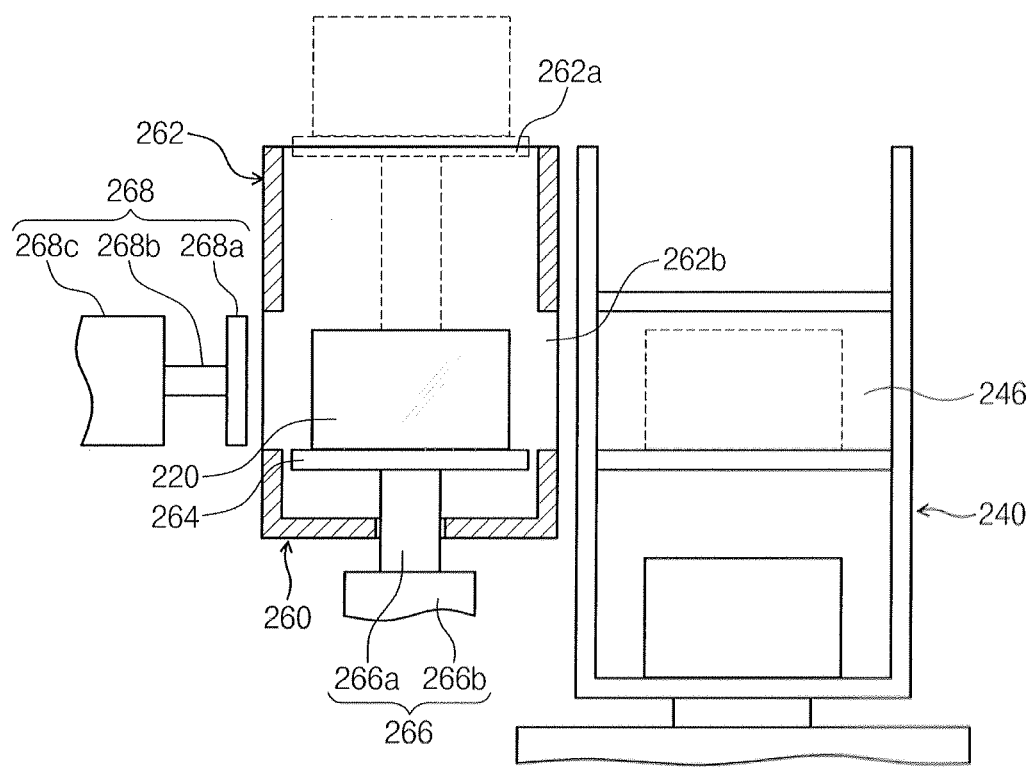
FIG. 7 is a sectional view illustrating an example of an input port of the packaging apparatus of FIG. 1.

FIG. 7 is a cross sectional view illustrating an input port 260 of the packaging apparatus 1 of FIGS. 1 and 5. The magazine 220 is disposed on the input port 260 to receive one or more processing objects 5 from the first treating unit 10. The magazine 220 with the processing object 5 moves to the input stacker 240. The input port 260 is disposed between the first treating unit 10 and the input stacker 240. The input port 260 includes a body 262, a supporting plate 264, a vertical driver 266 and a pusher 268. The body 262 may have a rectangular parallelepiped shape. However, the body may have different shape from the rectangular shape. Openings 262a and 262b are formed on an upper wall of the body 262 and on a sidewall of the body 262 facing the input stacker 240.

The supporting plate 264 supports the magazine 220 while the processing object 5 is moved to the magazine 220. The vertical driver 266 controls the supporting plate 264 to be located as illustrated as broken lines of FIG. 7 to be parallel to a bottom surface of the magazine 220 or the input port 260. The supporting plate 264 is located at the opening 262a on the upper wall of the body 262 such that the magazine 220 is disposed to receive the processing object 5.

The vertical driver 266 moves up or down the supporting plate 264 along the third direction 66. Processing objects 5 are sequentially inserted into the corresponding slots inside of the magazine 220 from a bottom toward a top of the magazine 220. Whenever one processing object 5 is inserted into the magazine 220, the vertical driver 266 moves downwardly the supporting plate 264 by a predetermined distance such that a next processing object 5 is inserted into a next slot disposed above the previous slot with the previous processing object 5. The vertical driver 266 includes a vertical shaft 266a connected to a bottom surface of the supporting plate 264 and a motor 266b to drive the vertical shaft 266a. A stepping motor may be used as the motor 266b.

The pusher 268 is disposed to move the magazine 220 with one or more processing objects 5 from the supporting plate 264 to the input stacker 240. The pusher 268 and the input stacker 240 are disposed on opposite sides of the supporting plate 264. The pusher 268 includes a pushing plate 268a. The pushing plate 268a is facing the magazine 220 disposed on the supporting plate 264. A horizontal shaft 268b is connected to a back side of the pushing plate 268a to move by a cylinder 268c connected to the horizontal shaft 268b. The cylinder 268c may be used to fast move the pushing plate 268a compared to other unit to move the pushing plate 268a. However, it is possible that other type of a motor may be used to move the pushing plate 268a. The magazine 220 disposed on the supporting plate 264 is moved to a receiving space 246 of the input stacker 240 by the pusher 268 through the opening 262b provided on a sidewall of the body 262. And then, the supporting plate 264 upwardly moves and a new magazine 220 is disposed on the supporting plate 264. The magazine 220 may be placed on the supporting plate 264 by a worker or a moving robot (not illustrated).

The stacker moving member 280 moves the input stacker 240 so that the magazine 220 with the one or more processing objects 5 is transferred from the input port 260 to a vacant receiving space 246 of the input stacker 240. The stacker moving member 280 moves the input stacker 240 so that the magazine 220 is disposed to face the heating unit 30, so that a process can be performed on the one or more processing objects 5 in the heating unit 30.

Referring again to FIGS. 4 and 6, the stacker moving member 280 includes a moving plate 282, a vertical driver 284, and a horizontal driver 286. The moving plate 282 has the shape of a rectangular plate. The vertical driver 284 moves the input stacker 240 linearly in the third direction 66 with respect to the moving plate 282. The vertical driver 284 has one or more guide plates 284a, one or more moving shafts 284b, and one or more motors 284c. The guide plates 284a extend from either end of the moving plate 282 in the third direction 66. Each guide plate 284a defines a guide slot 285. The guide slot 285 is defined elongated in the third direction 66. The guide slots 285, when viewed from above, are defined in four corners of the input stacker 240, respectively. Protrusions 241 are provided at the outermost vertical plates 244 to couple with the corresponding guide slots 285 and move in the third direction 66 along the guide slots 285. The moving shaft 284b is coupled to the front of the input stacker 240, and the motor 284c moves the moving shaft 284b in the third direction 66. A stepping motor may be employed as the motor 284c.

The horizontal driver 286 moves the moving plate 282 linearly in the second direction 64. The horizontal driver 286 includes a screw 286a, horizontal guides 286b, and a motor 286c. The screw 286a is inserted in a screw hole 282a defined in the moving plate 282, and is rotated by the motor 286c. The horizontal guide 286b is disposed extending in the second direction 64 at either side of the screw 286a. In the present embodiment, the horizontal driver 286 is described as having a driving assembly employing a screw 286a and a motor 286c; however, a linear motor may be used as an alternative. The motor 285c controls the screw 286a to rotate such that the moving plate 282 moves in the second direction 64 such that a corresponding space of the input stacker 240 can correspond to the magazine 220 and such that the magazine 220 can be transferred to the corresponding space of the input stacker 240. Also, the stacker moving unit 280 controls the input stacker 240 to move in the third direction 66 such that a corresponding space of the input stacker 240 can corresponding the magazine 220 and such that the magazine 220 can be transferred to the corresponding space of the input stacker 240.

Figure 8:
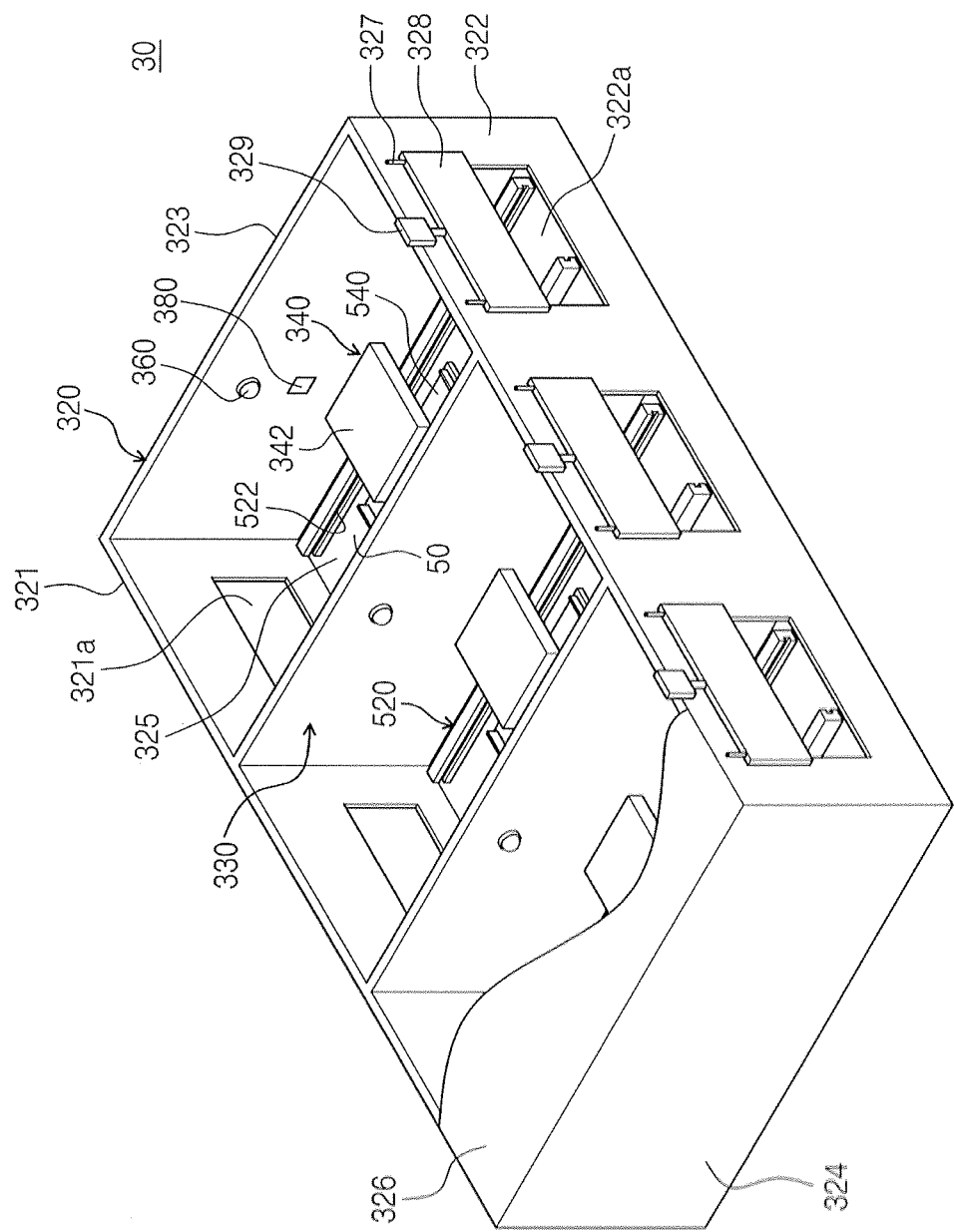
FIG. 8 is a perspective view illustrating an example of a heating unit of the packaging apparatus of FIG. 1.

FIG. 8 is a perspective view illustrating an example of a heating unit 30 of the packaging apparatus 1 of FIGS. 1 and 4 to generate heat provided to the solder balls 56 of the processing objects 5 to perform a reflow process.

The heating unit 30 includes a chamber 320 and a heating member 340. The chamber 320 includes a front wall 321, a rear wall 322, sidewalls 323 and 324, a floor 325, and a ceiling 326. The front wall 321 is disposed to face the input stacker 240, and the rear wall 322 is disposed to face the front wall 321 to form a space therebetween to receive the processing objects 5, 5'. The chamber 320 may be substantially hexahedral shape, and is formed of a metal such as aluminum for electromagnetic interference (EMI) shielding. However, the chamber 320 may have a different shape from the hexahedron.

At least one heating room 360 is provided to the chamber 320. Each of the heating rooms 360 is disposed so that a length direction of the heating rooms 360 is provided along the first direction 62. When a plurality of the heating rooms 360 is provided in the heating unit 30, the heating rooms 360 are disposed to be adjacent to each other along the second direction 64. The heating rooms 360 may be divided by blocking walls 330 which are disposed in parallel to the side walls 323 and 324. An entrance 321a is formed on the front wall 321 and an exit 322a is formed on the rear wall 322. The entrance 321a provides a path through which a processing object 5 is inputted into the chamber 320, and the exit 322a provides a path through which a processing object 5 is outputted from the chamber 320. Each of the heating rooms 360 has the entrance 321a and the exit 322a. A shutter 328 which opens and shuts the entrance 321a or opens and shuts the exit 322a is provided to the chamber 320. The shutter 328 opens and shuts the entrance 321a or the exit 322a by being moved up and down by a moving unit 329. A cylinder can be used as the moving unit 329. A guide 327 may be provided to guide a linear movement of the shutter 328. The shutter 328 is formed of a metal material such as aluminum for electromagnetic interference (EMI) shielding.

One or more rails 522 can be provided in each heating room 360 to guide the processing object or the magazine having one or more processing objects from the entrance 321a to the exit 322a. A moving member 540 can also be provided in each heating room 360 to move the processing object or the magazine having one or more processing objects along the rails 522.

The heating member 340 heats the solder balls 56 using an induction heating method. When alternating current (AC) is applied to a coil, an AC electromagnetic field is generated within the coil. A conductor provided at the region where the electromagnetic field is generated has an eddy current generated in a direction perpendicular to the direction of the electromagnetic field. The eddy current flows along the surface of the conductor to be consumed by generating heat. Induction heating methods use the heat thus generated to heat a processing object.

Figure 9:
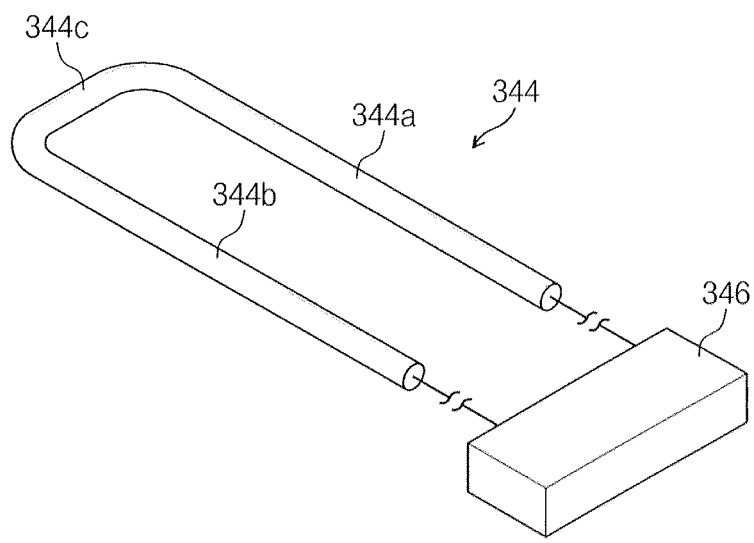
FIGS. 9 and 10 are perspective views illustrating examples of coils of a heating unit.
Figure 10:
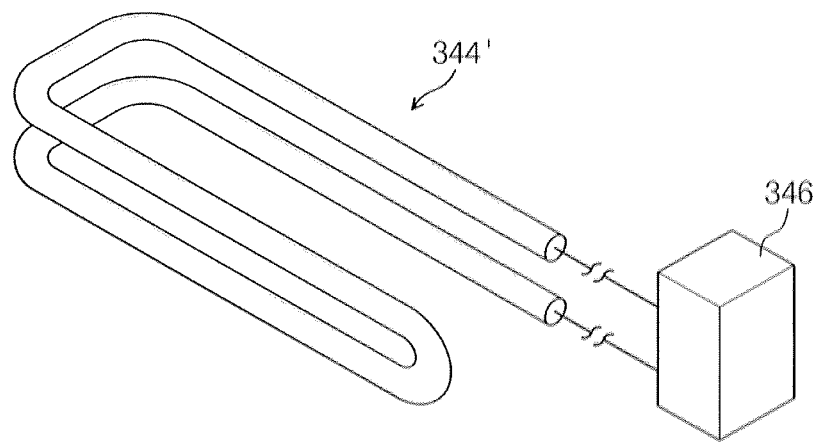

The heating member 340 includes a housing 342, a coil 344 (in FIG. 9), and a power supply 346 (in FIG. 9). The housing 342 is container-shaped to define a space for accommodating insertion of the coil 344 therein. In one example, the housing 342 has a hexahedral shape. The coil 344 is inserted and fixed within the housing 342. The coil 344 in FIG. 9 includes two straight portions 344a and 344b formed linearly, and a curved portion 344c rounded to connect the straight portions 344a and 344b. The coil 344' in FIG. 10 may have two connected sets of straight portions 344a and 344b and curved portions 344c in FIG. 9. The sets are connected to one another and are provided above and below one another at different levels.

The power supply 346 applies AC current to the coil 344. The current provided may have a frequency ranging from about several tens of kilohertz (KHz) to several megahertz (MHz). The regions heated by the heating member 340 are the portions above and below the regions enclosing the two pairs of straight portions 344a and 344b and curved portions 344c. The heating member 340 is provided in the heating room 360.

The process is performed using an induction heating method, and the time required for heating is very short. Thus, the reflow process can be performed quickly. Also, when induction heating methods are used, the conductor is heated, while the semiconductor chip 54 or the PCB 52 is not directly exposed to high temperatures. Accordingly, warpage due to thermal deformation of the semiconductor chip 54 or the PCB 52 can be prevented. Further, because the configuration of the heating member 340 is simple and its installation area is narrow, the overall area of the reflow apparatus 1 can be reduced.

Figure 11:
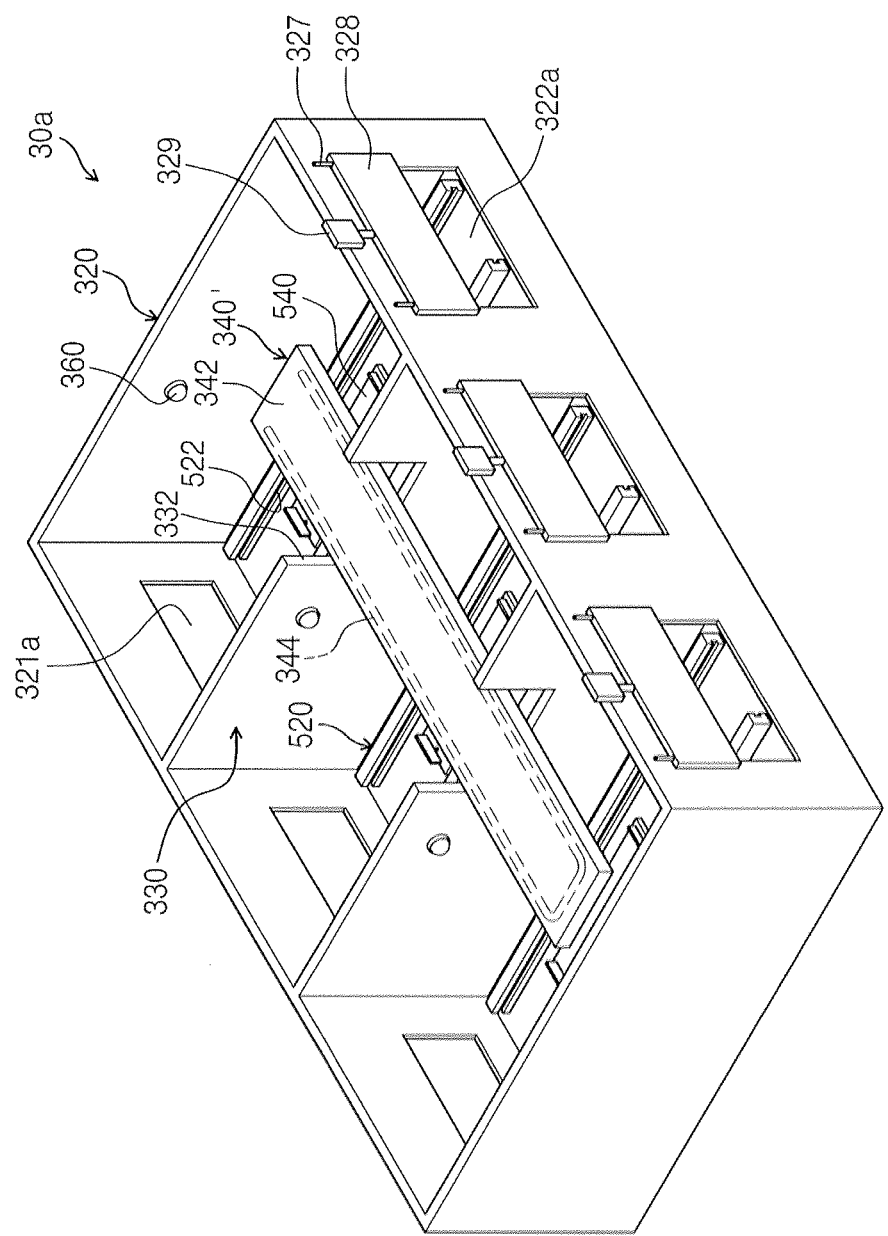
FIGS. 11 through 14 are perspective views illustrating heating members of a heating unit, respectively.

FIG. 11 is a perspective view illustrating another example of a heating unit 30a. A plurality of heating rooms 360 is arranged in the second direction 64 in the chamber 320. The plurality of heating rooms 360 may be disposed parallel to each other or disposed so that the heating rooms 360 can receive and discharge the processing objects and/or magazines 220 in the first direction 62. The heating member 340' is disposed in the second direction 64 to intersect with the plurality of heating rooms 360. The blocking walls (partitions) 330 define openings 332 through which a housing 342 of the heating member 340' is inserted. When the heating unit 30a in FIG. 11 is used, processing objects 5 provided in the plurality of heating rooms 360 may simultaneously be heated using one coil 344 and one power supply 346. Either end of the housing 342 may be fixed and installed at either sidewall 323 and 324 of the chamber 320, respectively. In the case of the heating unit 30a in FIG. 11, the processing objects 5 can be inserted into the respective heating rooms 360 at the same time. However, when AC current is continuously applied to the coil 344, the processing objects 5 may be inserted in the heating rooms 360, respectively, at different times.

Figure 12:
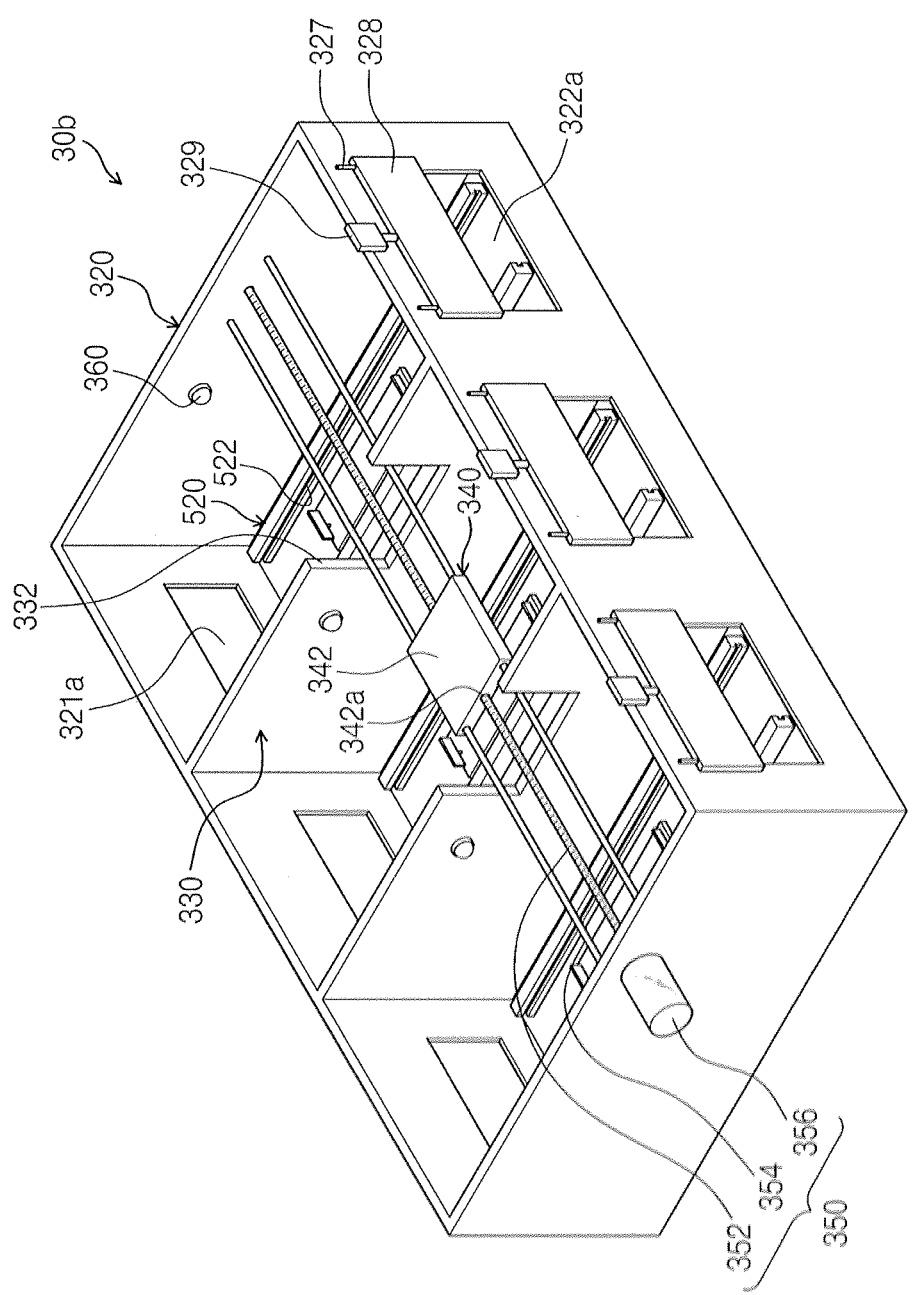

FIG. 12 illustrates another example of a heating unit 30b. The heating member 340' is provided in the chamber 320 to be movable between heating rooms 360 by a heating member mover 350. An opening 332 is defined in each blocking wall (partition) 330 to enable the housing 342 to pass through. The heating member mover 350 includes a screw 352, a guide 354, and a motor 356. The screw 352 is disposed in the second direction 64 to intersect all of the plurality of heating rooms 360. The screw 352 is disposed to pass through the openings 332 of the partitions 330. A housing 342 defines a screw hole 342a, and the screw 352 is inserted in the screw hole 342a of the housing 342 such that the housing 342 moves in the second direction 64 according to a feeding force (or a rotation) of the screw 352. Also, a guide 354 is respectively provided at either side of the screw 352 and disposed parallel to the screw 352. The guides 354 are fixedly installed to the chamber 320, and the housing 342 is coupled to the guides 354 to move linearly along the guides 354 according to the feeding force. In the heating unit 30b in FIG. 12, the processing objects 5 can be inserted in the respective heating rooms 360 at different times. However, even when the processing objects 5 are inserted simultaneously in the respective heating rooms 360, while processing objects 5 are standing by in the heating room 360, the heating member 340" can perform a reflow process by sequentially moving between the respective heating rooms 360.

Figure 13:
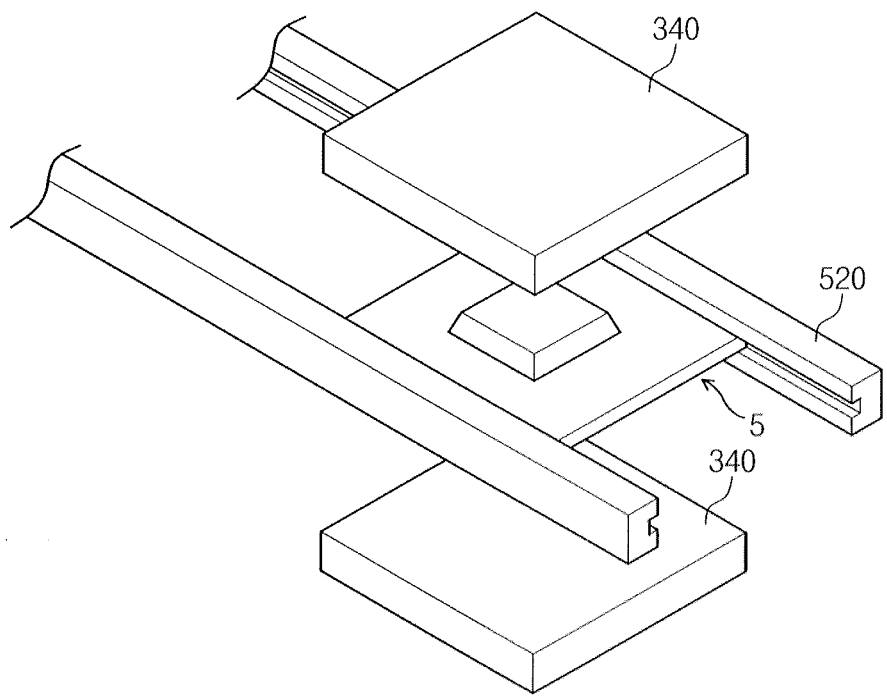
Figure 14:
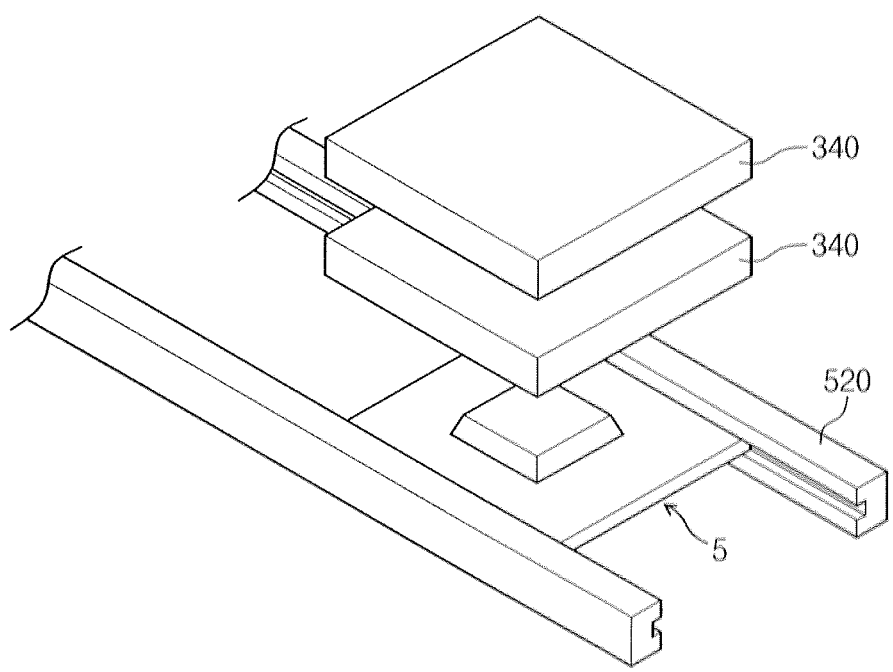

In above-described examples, the heating member 340, 340', 340" has been illustrated as being disposed above the processing object 5. Alternatively, the heating member 340 may be disposed below the processing object 5. Moreover, as illustrated in FIG. 13, the heating member 340 may be provided in duplicate, with one facing the other from above, and the processing object 5 may be positioned between the two heating members 340. When the heating members 340 are provided in plurality above and below one another, heating time can be further reduced. Alternatively, as illustrated in FIG. 14, the heating member 340 may be provided in stacked plurality above or below the processing objects 5.

Figure 15:
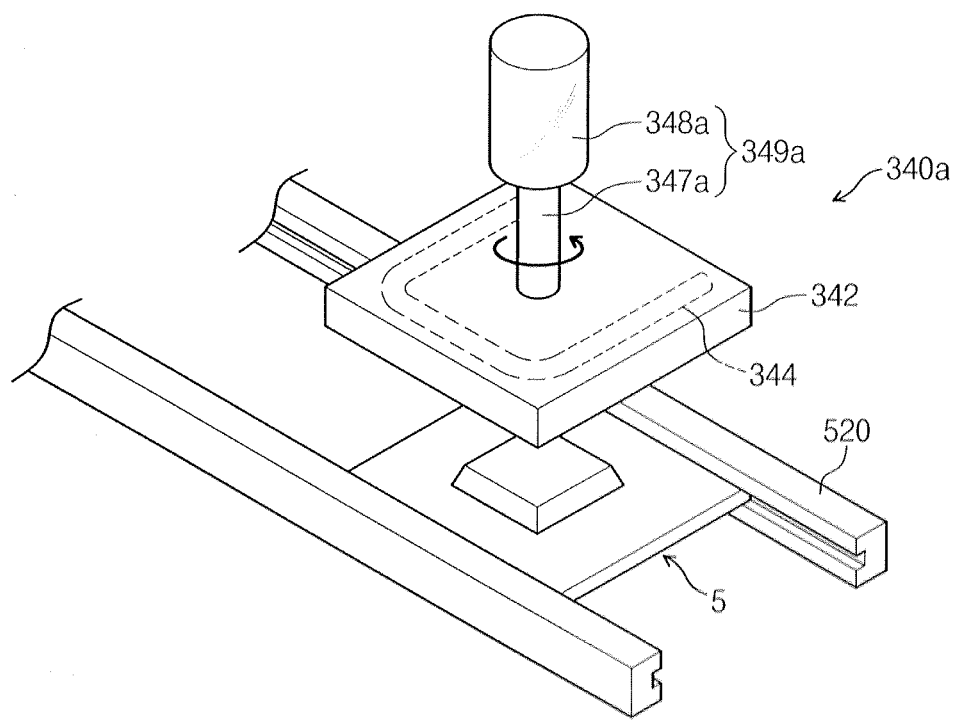
FIGS. 15 to 16b are perspective views respectively illustrating a heating member of a heating unit.
Figure 16A:
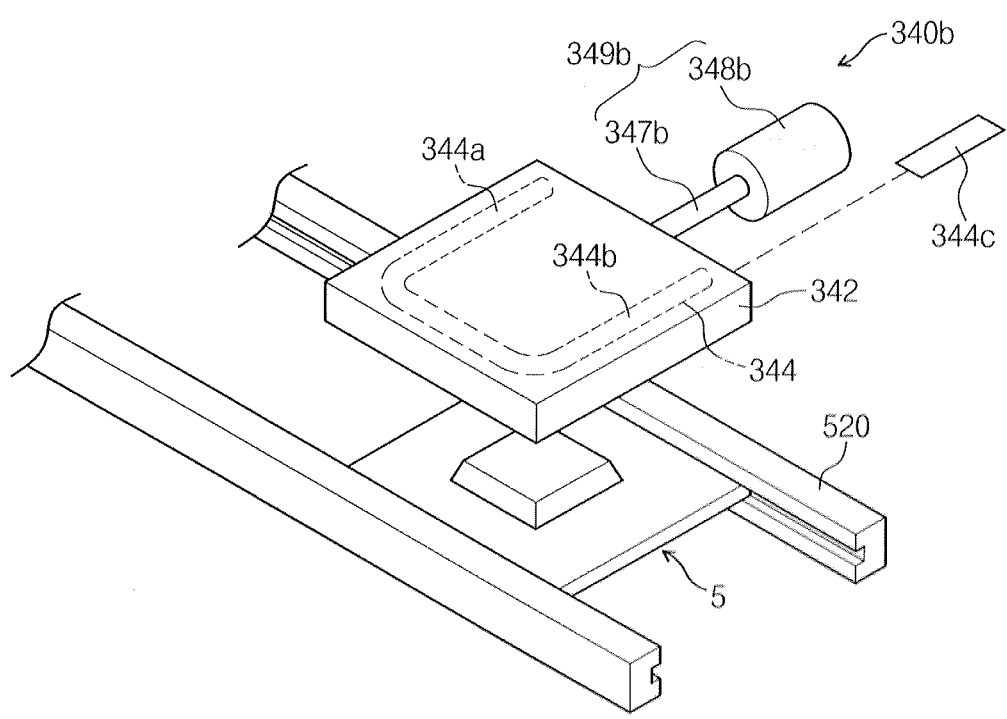
Figure 16B:
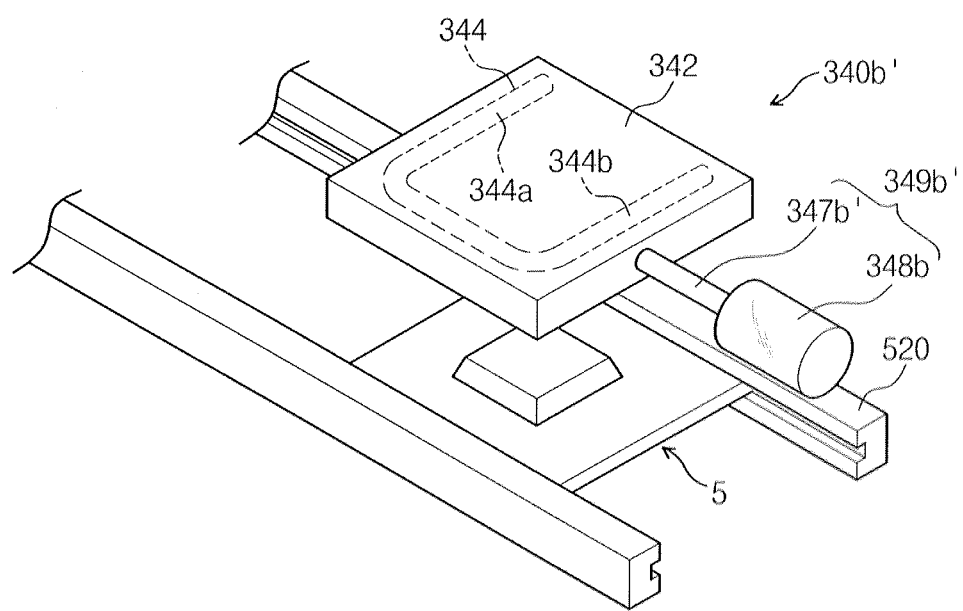

FIGS. 15 through 16B are views illustrating other examples of heating members 340a, 340b, and 340b'. The heating members 340a, 340b, and 340c include a housing 342, a coil 344 to which a power supply is connected, and rotating members 349a, 349b, and 349c. The housing 342 and the coil 344 are similar to those described above, and therefore, repetitive descriptions thereof will not be given. The rotating members 349a, 349b, and 349b' rotate either the coil 344 or the processing object 5 to alter relative positions of the coil 344 and the processing object 5. The rotation of the coil 344 may be achieved by rotating the housing 342.

As illustrated in FIG. 15, the rotating member 349a is rotated the coil 344 on plane that the coil is placed. The plane may be a horizontal plane. The coil 344 is fixed and installed in the housing 342, and the housing 342 is provided to be substantially parallel to the processing object 5 to be heated. The rotating member 349a includes a rotating shaft 347a fixed and coupled to the ceiling of the housing 342 in which the coil 344 is fixed and installed, and a motor 348b providing a rotational force to the rotating shaft 347a. The motor 348b may be fixedly coupled to a portion of the heating chamber 320. A plurality of solder balls 56 are provided on a semiconductor chip 54 as illustrated in FIGS. 2 and 3, for example. When heating is performed using the coil 344, it is possible that heating of the solder balls 56 is uneven. When heating is performed by rotating the coil 344 in a parallel plane as illustrated in FIG. 15, it is possible that the heating of the solder balls 56 can be performed in more efficiently. The rotating member 349a may continuously or intermittently rotate the coil 344 in one direction, or rotate the coil 344 in alternating directions. Also, the rotating member 349a may either rotate the coil 344 continuously without stopping, or repeat a cycle of stopping and resuming rotation of the coil 344 at predetermined rotated angles.

As described above, the rotating member 349a controls the coil 344 to rotate. However, the present general inventive concept is not limited thereto. It is possible that the coil 344 may be fixed, and the processing object 5 may be rotated by a rotating member on plane that the processing object 5 is placed. In this case, the structure of the moving unit 50 may be different to that in the present embodiment. For example, the processing object may be heated while seated on a rotating plate (not shown), and the rotating plate may be rotated while heating is performed. Selectively, the coil 344 and the processing object 5 may be rotated in relatively different or opposite directions at the same time.

Figure 17:
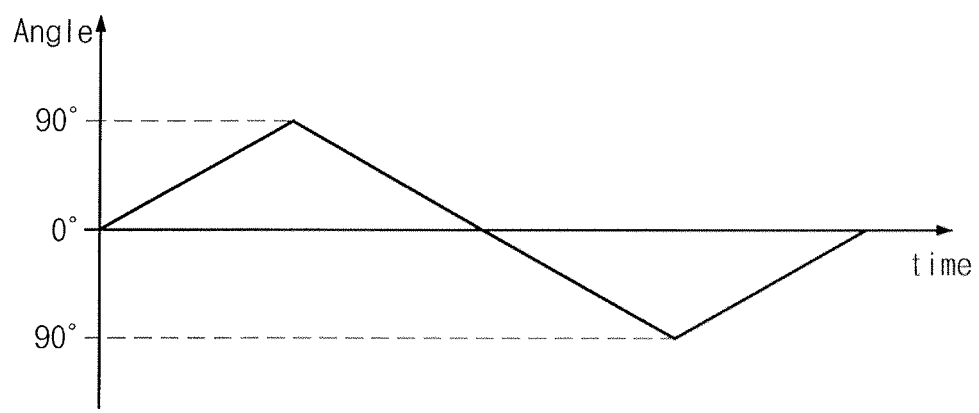
FIGS. 17 and 18 are graphs illustrating rotations of coils of the heating unit of FIGS. 16a and 16b, respectively.
Figure 18:
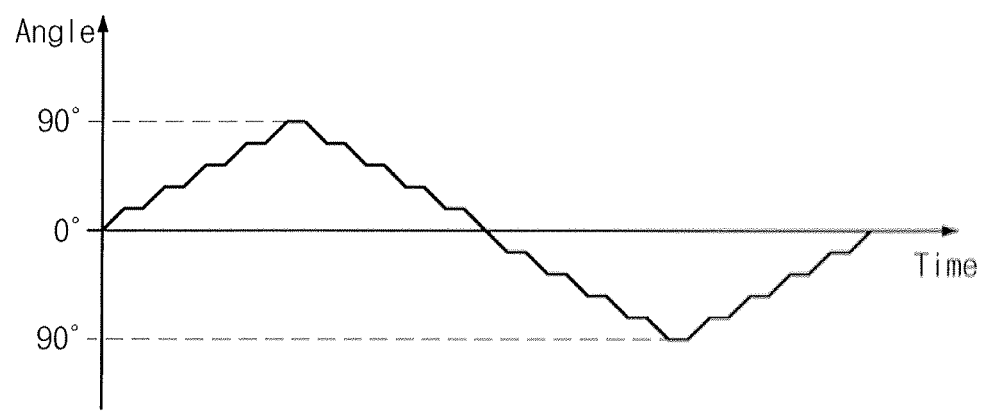

FIGS. 16A and 116B illustrate rotating members 349b and 349c. The rotating member 349b rotates the processing object 5 so that an angle between the coil 344 and the processing object 5 varies or a distance between the coil 344 and the processing objects 5 varies. The rotating member 349b includes a rotating shaft 347b fixed and coupled at a side of the housing 342 with the coil 344 installed thereon, and a motor 348b providing rotational force to the rotating shaft 347b. The rotating shaft 347b may be a shaft disposed parallel to the processing object 5. As illustrated in FIG. 16A, the rotating shaft 347b may be disposed parallel to two straight portions 344a and 344b of the coil 344 and disposed along a line passing between the straight portions 344a and 344b. The coil 344 is connected to a power supply 344c such that the power supply 344c supplies a current to the coil to generate heat. The power supply 344c may be controlled by the control unit 401 according to the transfer of the processing objects and/or the temperature of a temperature sensor of the heating chamber. The rotating shaft 347b' may be disposed along a line perpendicular to the two straight portions 344a and 344b of the coil 344, as illustrated in FIG. 16B. With the coil 344 provided parallel to the processing object, the coil 344 may be rotated in alternation to angles ranging from about −90° to about 90°. As illustrated in FIG. 17, during heating of the processing object 5, the rotating member 349 (349a, 349b, 349b') may continuously rotate the coil 344 without stopping. The rotating member 349b may repeat a cycle of stopping and resuming rotation of the coil 344 at predetermined rotated angles, as illustrated in FIG. 18.

As described above, the rotating member 349b controls the coil 344 to rotate. However, the coil 344 may be stationary, and the rotating member 349b may be configured to rotate the processing object 5 to vary the angle between the coil 344 and the processing object 5. Selectively, the coil 344 and the processing object 5 may be rotated simultaneously in relatively different or opposite directions.

Figure 19:
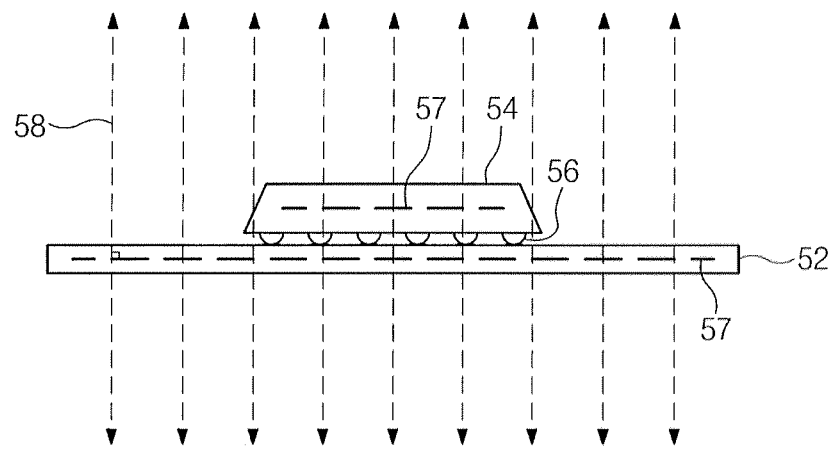
FIGS. 19 and 20 are diagrams illustrating angles between conductive lines and electromagnetic lines provided to a processing object according to a position of a coil.
Figure 20:
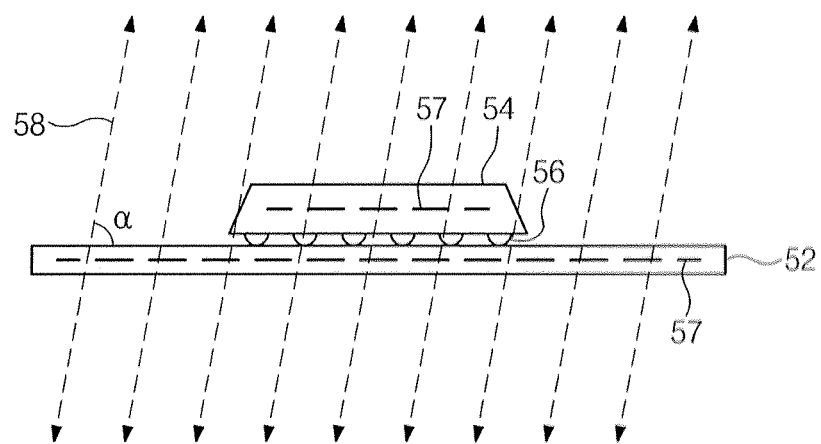

A plurality of conductive lines 57 is formed substantially horizontal within the PCB 52 and the semiconductor chip 54. When the coil 344 and the processing object 5 are parallel, the conductive lines 57 provided in the PCB 52 and the semiconductor chip 54 are perpendicular to electromagnetic lines 58 of force, as illustrated in FIG. 19, so that the conductive lines 57 are heated to a high temperature. However, when there is an angle (α) between the coil 344 and the processing object 5, as illustrated in FIG. 20, the angle formed between the electromagnetic lines 58 and the conductive lines 57 varies or is offset from a right angle, so that continued heating of the conductive lines 57 to a high temperature can be reduced. Accordingly, the rotation illustrated in FIG. 16 can reduce continued heating of the conductive lines 57 to a high temperature, and thus uniformly heat the entire region of a single solder ball 56. The electromagnetic lines 58 may be a transmitting direction of heat generated from the coil 34 and/or the heating member 340.

According to FIGS. 15-20, since at least one of the heating member and the processing object are controlled to relative move with respect to each other, an angle "a" between the electromagnetic lines 58 and a major surface of the conductive lines 57 of the semiconductor chip 54 and/or the PCB 52 varies such that the solder balls 56 can be uniformly heated to a certain temperature.

Figure 21:
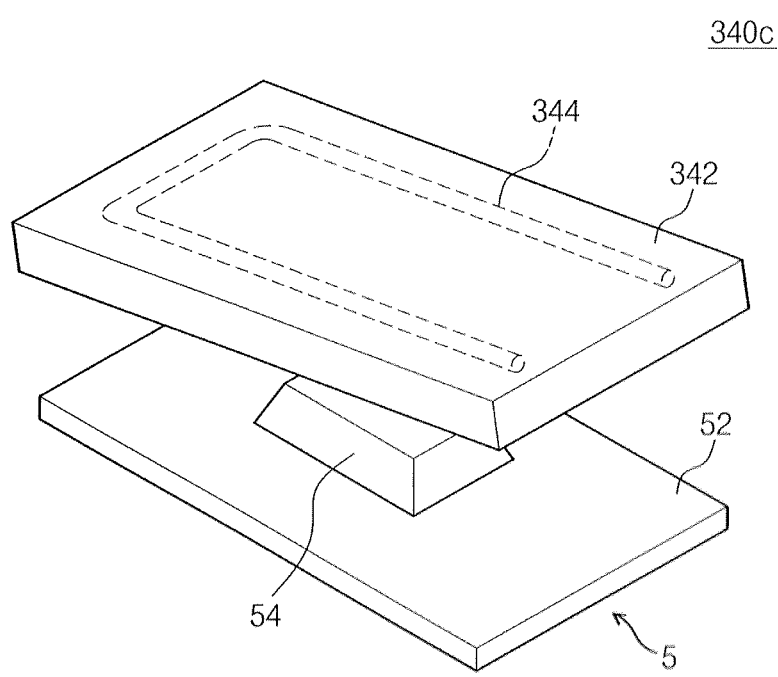
FIG. 21 is perspective view illustrating another example of a heating member of a heating unit.

FIG. 21 illustrates a heating member 340c. A coil 344 is fixed and installed within a chamber 320, and the coil 344 is disposed to be sloped with respect to a processing object 5, to prevent the conductive lines 57 within the semiconductor chip 54 or the PCB 52 from being heated to a high temperature. Selectively, with the coil 344 forming a slope with respect to the processing object 5, the coil 344 may be rotated about an axis perpendicular to a major surface of the processing object 5.

Referring back to FIG. 8, a sensor 380 is further provided to the heating member 340 to sense temperatures by region on the processing object 5 being heated by the heating member 360. The sensor 380 may be mounted on a wall of the heating chamber 360 or a portion of the heating member 340. It is possible that the sensor 380 may be disposed adjacent to the corresponding processing object in the corresponding heating chamber 320 to detect the temperature thereof. The sensor 380 senses whether high-speed heating in the heating unit 30 is being properly performed. For example, the sensor 360 may employ an infrared camera to show a visual image of regions of the processing object 5 to represent the temperature of the processing objects, and a display (not illustrated) that allows an operator to visually inspect the image captured by the infrared camera.

The sensed temperature of the sensor 380 can be transmitted to the control unit 401 to control the heating unit 30 to transfer the processing objects and to control the heating member 340.

It is also possible that each of the first treating unit 10, the input storage unit 20, the heating unit 30, and the output storage unit 40 may have a sensor to detect whether the processing objects 5 and magazines 220 are transferred or arrived therein or discharged from thereto or to detect the number of processing objects 5 and the magazines 220 stored therein. For example, the input storage unit 10 may have a sensor to detect whether each of the magazines 220 is filled with the predetermined number of processing objects 5 such that the vertical driver 266 of FIG. 7 can control the height of the magazine 220 with respect to the convey belt 190 to insert the processing object 5 into the corresponding slot 228 of the magazine 220. A detected signal can be transmitted to the vertical driver 266 or can be transmitted to the control unit 401 such that the control unit 401 controls the vertical driver 266. The detected signal can be used to determine whether the magazine 220 is filled with the predetermined number of the processing object 5, and the vertical driver 266 and the pusher 268 can be controlled to transfer the magazine 220 to the corresponding storage space. Accordingly, the control unit 401 receives detected signals representing the number of processing objects 5, the number of magazines 220, locations of the magazines, and so on, from the corresponding sensors of each of the first treating unit 10, the input storage unit 20, the heating unit 30, the output storage unit 40, the moving unit 50 and controls the first treating unit 10, the input storage unit 20, the heating unit 30, the output storage unit 40, and the moving unit 50 such that a predetermined number of processing objects 5 can be stored in each magazine 220, a predetermined number of magazines 220 can be stored in the input stacker 240, a predetermined processing objects and/or magazines 220 can be transferred from the input storage unit 20 to the heating unit 30, and a predetermined processing objects 5 and/or magazines 220 can be transferred from the heating unit 30 to the output storage unit 40.

Referring back to FIG. 4, the output storage unit 40 stores the processing objects 5 which reflow process was completed. The output storage unit 40 includes a magazine 420, an output stacker 440, an output port 460 and a stacker moving unit 480. A plurality of the processing objects 5 is received into the magazine 420 and a plurality of the magazines 420 is stored in the output stacker 440. The output port 460 is disposed to be adjacent to the heating unit 30. The heating unit 30, an output port 460 and an output stacker 440 are sequentially disposed in a straight line when viewed from a top plan view. The magazine 420, the output port 460, the output stacker 440 and a stacker moving member 480 of the output storage unit 40 have the same structure as the magazine 420, the input port 260, the input stacker 240 and the stacker moving member 280 of the input storage unit 20.

Figure 22A:
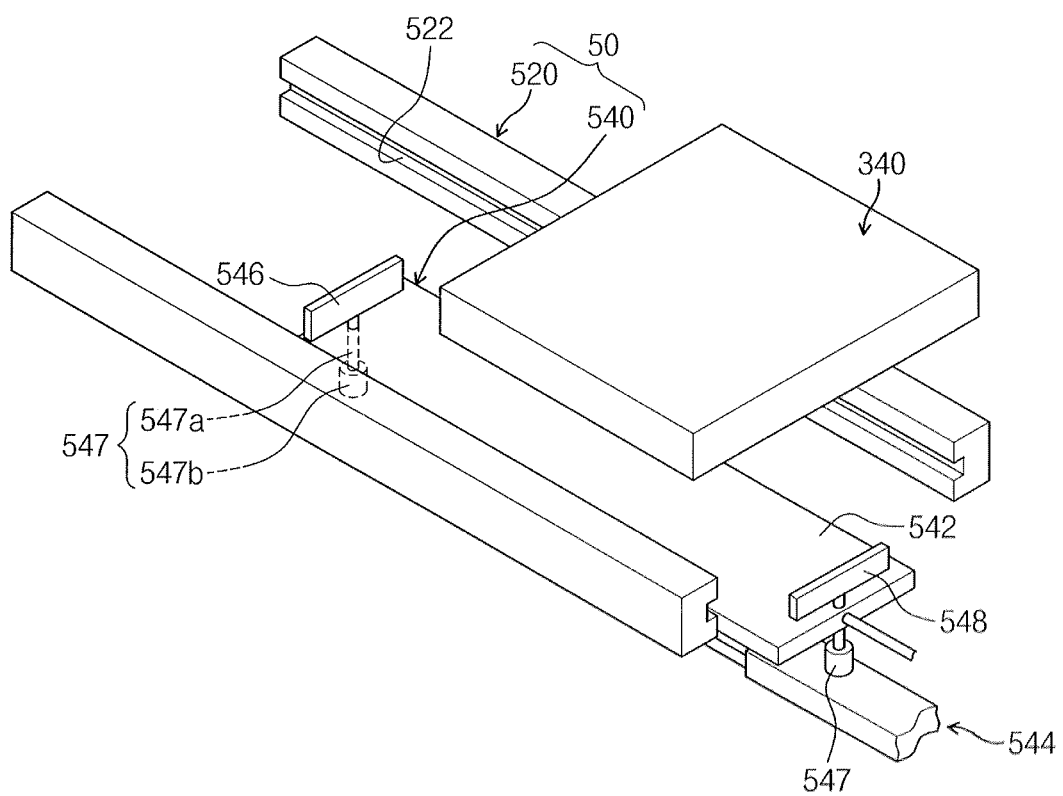
FIGS. 22A, 22B, and 22C are views illustrating a moving unit of the packaging apparatus of FIG. 1.

FIG. 22A illustrates a moving unit 50 of FIG. 8 to move processing objects 5 from the loader unit 20 to the heating unit 30 so as to perform the reflow process, and the processing objects 5 from the heating unit to the unloader unit 40 after the reflow process. The moving unit 50 includes a pair of rails 520 and a moving member 540.

The rails 520 are disposed along a moving path of the processing objects 5 to face each other within the heating room 360. The rails 520 extend in the first direction 62 from a region proximate to the entrance 321a of the heating room 360 to a region proximate to the exit 322a of the heating room 360. The rails 520 may be guides to guide a linear movement of the processing objects 5. Each rail 520 defines a slot 522 in its inner surface. The slot 522 extends longitudinally from one end of the rail 520 to the other end thereof. The edge regions of the processing objects 5 insert into the corresponding slots 522 of the rails 520, and the processing objects 5 move along the slots 522.

The moving member 540 removes processing objects 5 from the magazine 220 that are stored in the input stacker 240, and moves them along the rails 520. The moving member 540 includes a moving bar 542, an inserting finger 546, and a withdrawing finger 548. The moving bar 542 is formed in the shape of a bar, and is disposed in the heating room 360. The moving bar 542 may be disposed in a region below the rails 520. The moving bar 542 moves linearly within the heating room 360 in the first direction 62 by means of a driver 544. The driver 544 may employ a cylinder to quickly move a processing object 5. The cylinder may be coupled to the end region of the moving bar 542, which is a region facing the entrance 321a of the heating chamber 360. The inserting finger 546 and the withdrawing finger 548 are coupled to the moving bar 542 to be capable of vertical movement with respect to the moving bar 542. The inserting finger 546 is coupled to the moving bar 542 at the front region of the moving bar 542, and is disposed to remove a processing object 5 from a magazine 220 and to move the processing object 5 to the heating region. The withdrawing finger 548 is coupled to the moving bar 542 at the rear region of the moving bar 542, and moves a processing object 5 that has been heated from the heating region to a magazine 420 positioned on the front region 424 of the output port 460. The inserting finger 546 is disposed above the moving bar 542, and has a substantially rectangular shape. The inserting finger 546 and the withdrawing finger 547 are moved vertically by a driver 547. It is possible that the driver 547 independently move the inserting finger 546 and the withdrawing finger 547 in a vertical direction. A moving shaft 547a is fixed and coupled to the lower surface of the inserting finger 546, and the moving shaft 547a is coupled to the moving bar 542 to be capable of upward and downward movement using a cylinder 547b. The withdrawing finger 548 has the same shape as the inserting finger 546, and is coupled to the moving bar 542 with the same configuration as the inserting finger 546.

Referring to FIGS. 8 and 22A, a heating member 340 is disposed at the upper portion of the rails 520, and the moving member 540 is installed at the lower portion of the rails 520. However, the positional relation between the heating member 340, the rails 520, and the moving member 540 may be different. For example, the positions of the heating member 340 and the moving member 540 may be reversed, or both the heating member 340 and the moving member 540 may be provided in the upper portion or lower portion of the rails 520.

Figure 22B:
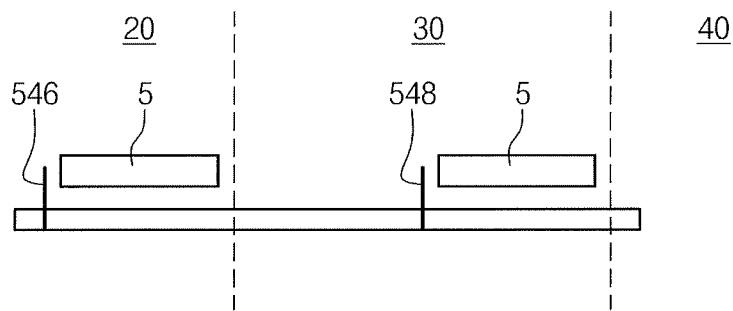
Figure 22C:
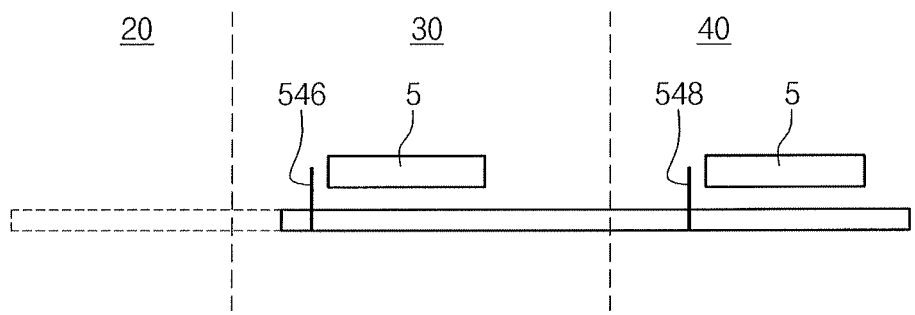

A description of the process of moving the processing objects 5 with the moving unit 50 will be provided below. The inserting finger 546 and the withdrawing finger 548 are positioned in a first position as illustrated in FIG. 22B. The first position refers to one in which the upper ends of the inserting finger 546 and the withdrawing finger 548 are lower than the processing object 5 that is to be moved. The moving bar 542 is moved forward and inserted in the magazine 220 to be disposed between the processing objects 5. The inserting finger 546 is disposed beyond the position of a processing object 5 within a magazine 220, and the withdrawing finger 548 is disposed beyond the position of a processing object 5 within a heating region as illustrated in FIG. 22B. Then, the inserting finger 546 and the withdrawing finger 548 move to be disposed in a second position as illustrated in FIG. 22C. The second position refers to one where the upper ends of the inserting finger 546 and the withdrawing finger 548 are higher than the processing object 5 to be withdrawn. The moving bar 542 is moved rearward, so that the inserting finger 546 moves a processing object 5 from the magazine 220 to the heating region, and the withdrawing finger 548 moves a processing object 5 from the heating region to the magazine 420 positioned on the output port 460.

FIGS. 8 and 22A illustrate the structure and form of the moving unit 50; however, the structure and form of the moving unit 50 may be embodied in various other ways. For example, FIG. 22A illustrates the inserting finger 546 and the withdrawing finger 548 coupled to one moving bar 542. Alternatively, the inserting finger 546 and the withdrawing finger 548 may be moved independently from one another.

Figure 23:
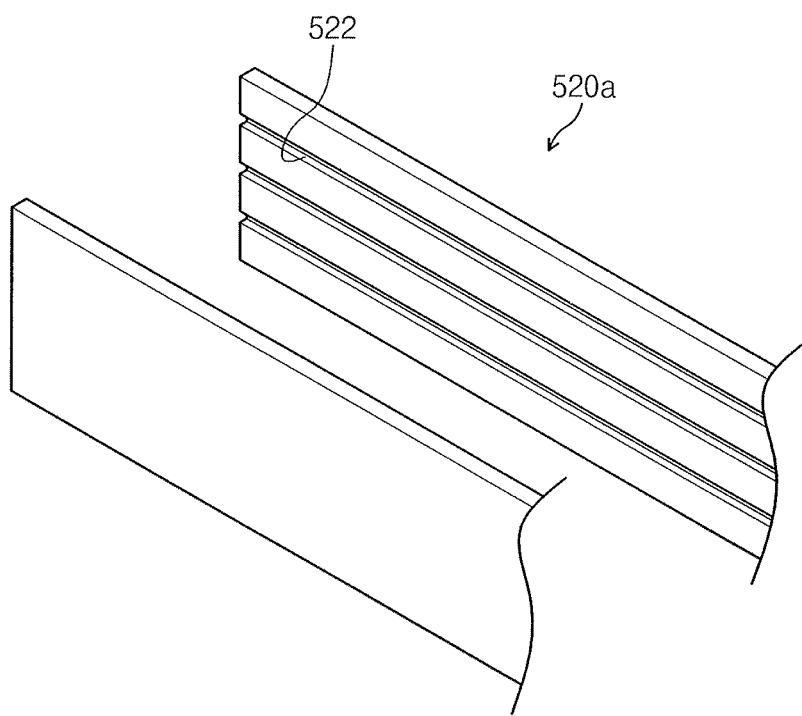
FIG. 23 is a perspective view illustrating an example of a rail of the moving unit of FIG. 22.
Figure 24:
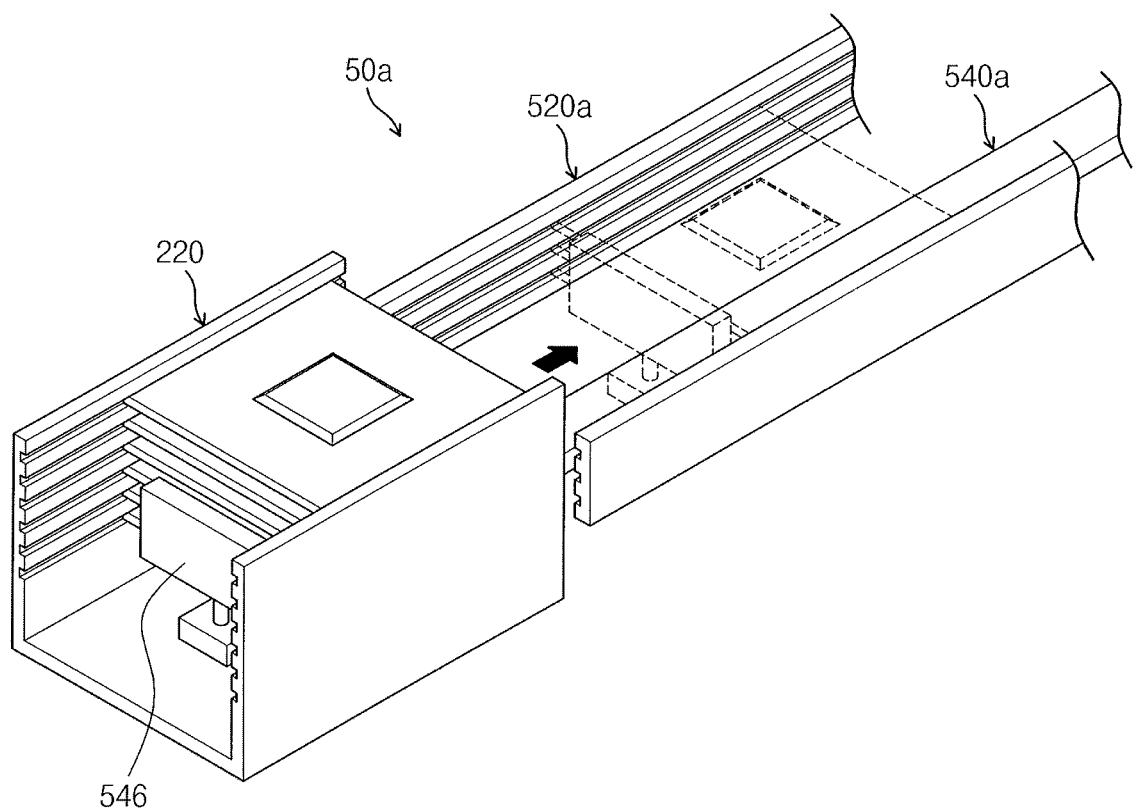
FIG. 24 is a perspective view illustrating a process of moving a processing object using rails of FIG. 23.

FIGS. 23 and 24 illustrate another example of a moving unit 50a. FIG. 23 is a perspective view of rails 520a, and FIG. 24 illustrates the process of a processing object 5 moved by means of the moving unit 50a. When employing an induction heating method, heating is performed in a region in which an electromagnetic field is formed. As an electromagnetic field is formed vertically, when processing objects 5 are provided stacked within the heating region, a plurality of processing objects 5 can be heated simultaneously. The moving unit 50a simultaneously moves vertically stacked processing objects 5 to the heating room 360, to simultaneously heat a plurality of processing objects 5 within the heating room 360. The moving unit 50a includes a pair of rails 520a and a moving member 540a. The pair of rails 520a and the moving member 540a have substantially the same form as the pair of rails 520 and the moving member 540 of the moving unit 50 in FIG. 22. The pair of rails 520a of FIG. 23 has a plurality of slots 522 defined therein. The slots 522 are defined at predetermined vertical intervals apart from each other to correspond to the slots of rails of the magazine 220. The inserting finger 546a and the withdrawing finger (not shown) of the moving member 540a are vertically longer than the inserting finger 546 and the withdrawing finger 548 of the moving member 540 in FIG. 22. Accordingly, as illustrated in FIG. 24, the moving member 540a removes a plurality of processing objects 5 simultaneously from a magazine 220, and moves them simultaneously along a pair of rails 520a.

Figure 25:
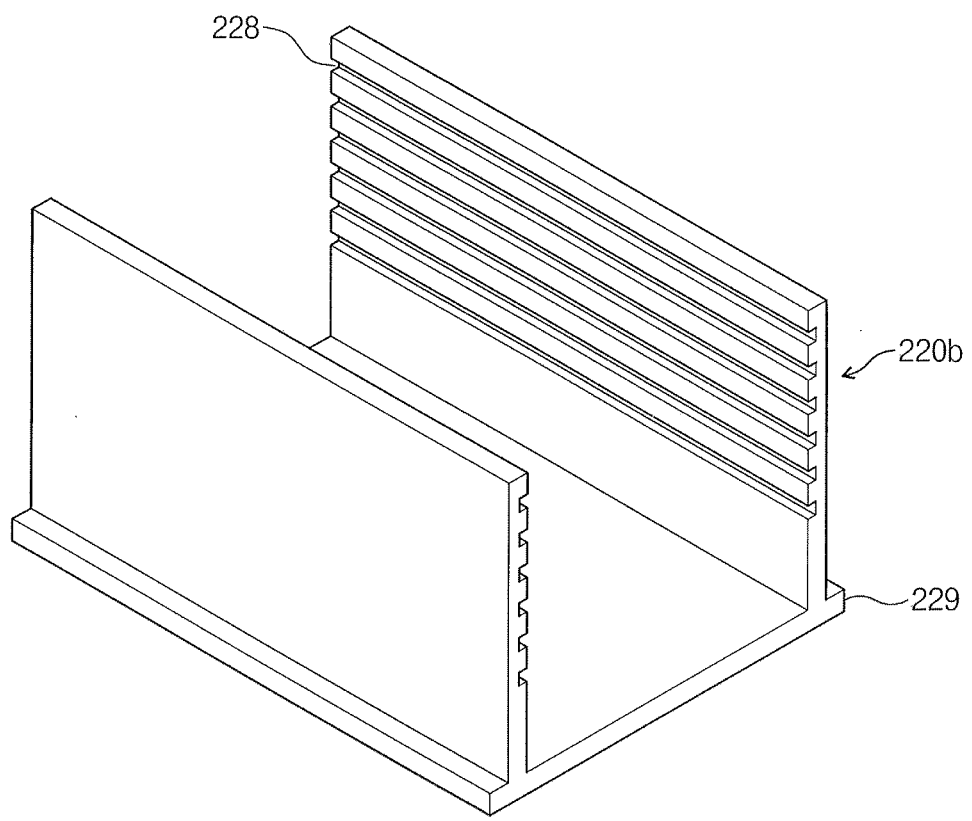
FIG. 25 is a perspective view illustrating a magazine of a moving unit of an packaging apparatus.
Figure 26:
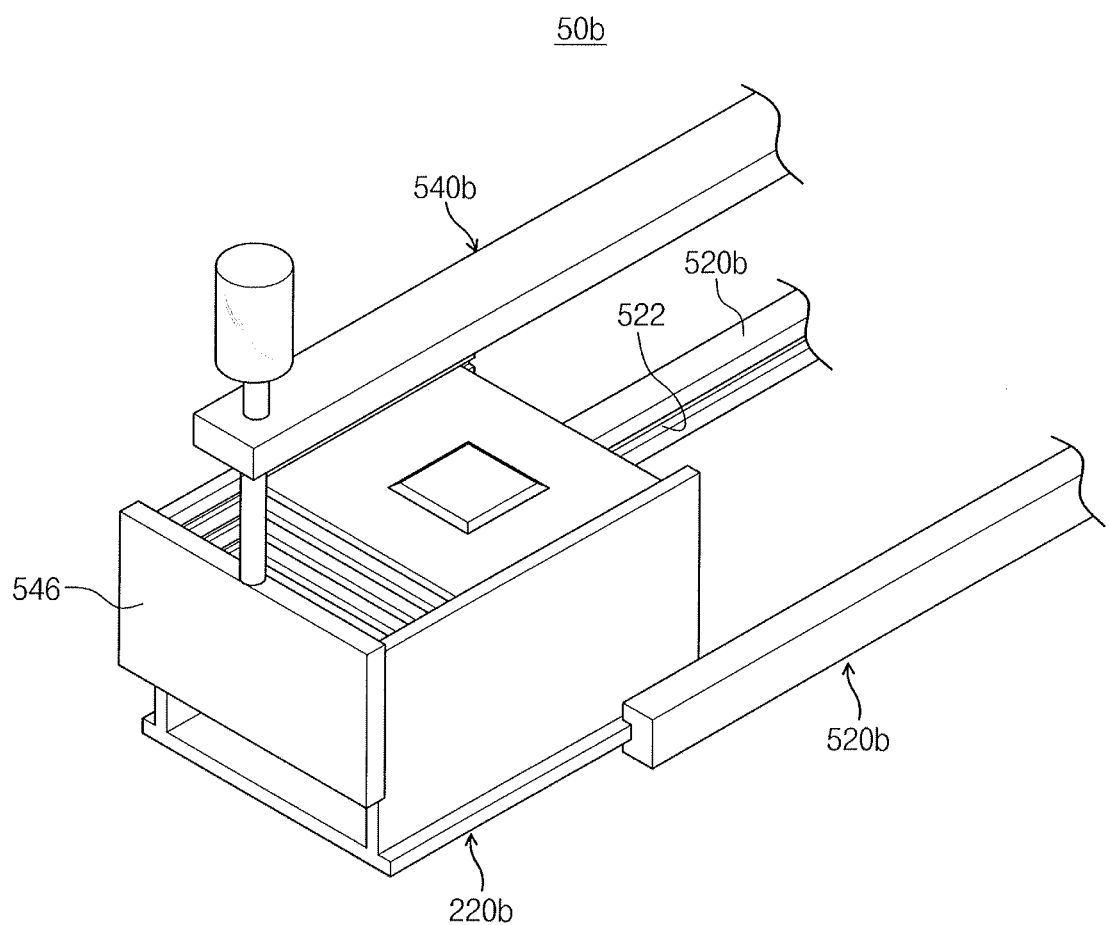
FIG. 26 is a perspective view illustrating a process of moving a processing object using the magazine of FIG. 25.

FIGS. 25 and 26 illustrate another example of a magazine 220b and a moving unit 50b to move the magazine 220b. FIG. 25 is a perspective view illustrating a magazine 220b, and FIG. 25 illustrates a process of moving the magazine 220b of FIG. 26. The moving unit 50b moves a magazine 220b positioned on an input stacker 240 to a heating unit 30, and moves a magazine 220b within the heating unit 30 to an output port 460. In one example, the moving unit 50b includes a pair of rails 520b and a moving member 540b. The pair of rails 520b and the moving member 540b have substantially the same configurations as the pair of rails 520 and the moving member 540 of FIG. 22. The inserting and withdrawing fingers (not illustrated) of the moving member 540b are configured to directly move the magazine 220b of FIG. 25. As illustrated in FIG. 25, the magazine 220b has a guide protrusion 229 on either sidewall thereof projecting outward. The guide protrusions 229 are formed to be inserted into the slots 522 defined in the rails 520 to move therein. FIG. 26 illustrates a magazine 220b moved directly by a moving member 50 along the rails 520. In FIG. 26, the moving member 540b is disposed above the rails 520b.

When the magazine 220b is moved directly to the heating region, the magazine 220b is made of a non-metal material. If the magazine 220b were to be made of a metal material, the magazine 220b would also be heated during heating of the processing objects 5 in the heating region. In this case, the magazine 220b could heat the processing objects 5 and cause warpage of the processing objects 5.

In the above example, the guide protrusion 229 is provided on the magazine 220b, and the magazine 220b has been described as being directly inserted in the slots 522 of the rails 520b. Alternatively, a moving plate (not illustrated) may be provided to be inserted in the slots 522 of the rails 520, and the magazine 220 may be seated and moved thereon. In this case, the magazine 220b can be disposed on the moving plate to be transferred.

Referring to FIGS. 24 and 25, when a plurality of processing objects 5 is stacked and moved to the heating unit 30, the heating unit 30 may be provided above and below the processing objects, respectively. This is to improve heating uniformity of the processing objects 5.

Performing a process using the package apparatus 1 according to an embodiment of the present general inventive concept will be described. In a below, an apparatus of a structure that one processing object 5 is moved to a heating room 360 is described as an example. A processing object 5 of which a chip mount process or a ball attach process in the first treating unit 10 is completed is received in the magazine 220 disposed on the input port 260. Whenever the processing object 5 is received to the magazine 220, the supporting plate 264 disposed on the magazine 220 is downwardly moved by a predetermined distance to receive a next processing object in a next slot 228 formed above a slot which has been inserted with a previous processing object and/or by a predetermined distance to display the magazine 220 to correspond to the storage space of the input stacker 240. The input stacker 240 is moved so that a vacant receiving space 246 is disposed to face the magazine 220. The magazine 220 that a receipt of the processing object 5 is completed is moved to the vacant receiving space 246 in the input stacker 240 by the pusher 268. The supporting plate 264 rises to the original position again and a new magazine 220 is disposed on the supporting plate 264 by a moving unit (not illustrated). The process described above is continuously repeated.

The input stacker 240 is moved so that the receiving space 246 on which the magazine 220 that a reflow process will be performed is disposed to face the entrance of the heating room 360.

Next, the entrance 321a and exit 322a of the heating room 360 open. The inserting finger 546 of the moving member 540 removes the processing object 5 stored in the magazine 220 and moves it to the heating region of the heating unit 30. The processing object 5 that was heated in the heating region is stored in the magazine 420 positioned on the output port 460 by the withdrawing finger 548. The entrance 321a and exit 322a of the heating room 360 are closed, and heating of a next processing object 5 is performed. This process is continually repeated.

When all the processing objects 5 are taken out of the magazine 220 disposed on the input stacker 240, the input stacker 240 is moved so that the magazine 220 received in a different receiving space 246 faces the entrance 321a of the heating room 360. The vacant magazine 220 is removed from the input stacker 240 by a moving unit (not illustrated). A pusher (not illustrated) is provided to one side of the input stacker 240 to remove the vacant magazine 220 from the input stacker 240. When a reflow process is performed and completed on the processing objects 5, the processing objects are transferred to and received in the magazine 420 disposed on the output port 460, the magazine 220 is moved to the vacant receiving space 246 of the output stacker 440 and is stored in the output stacker 440.

Figure 27:
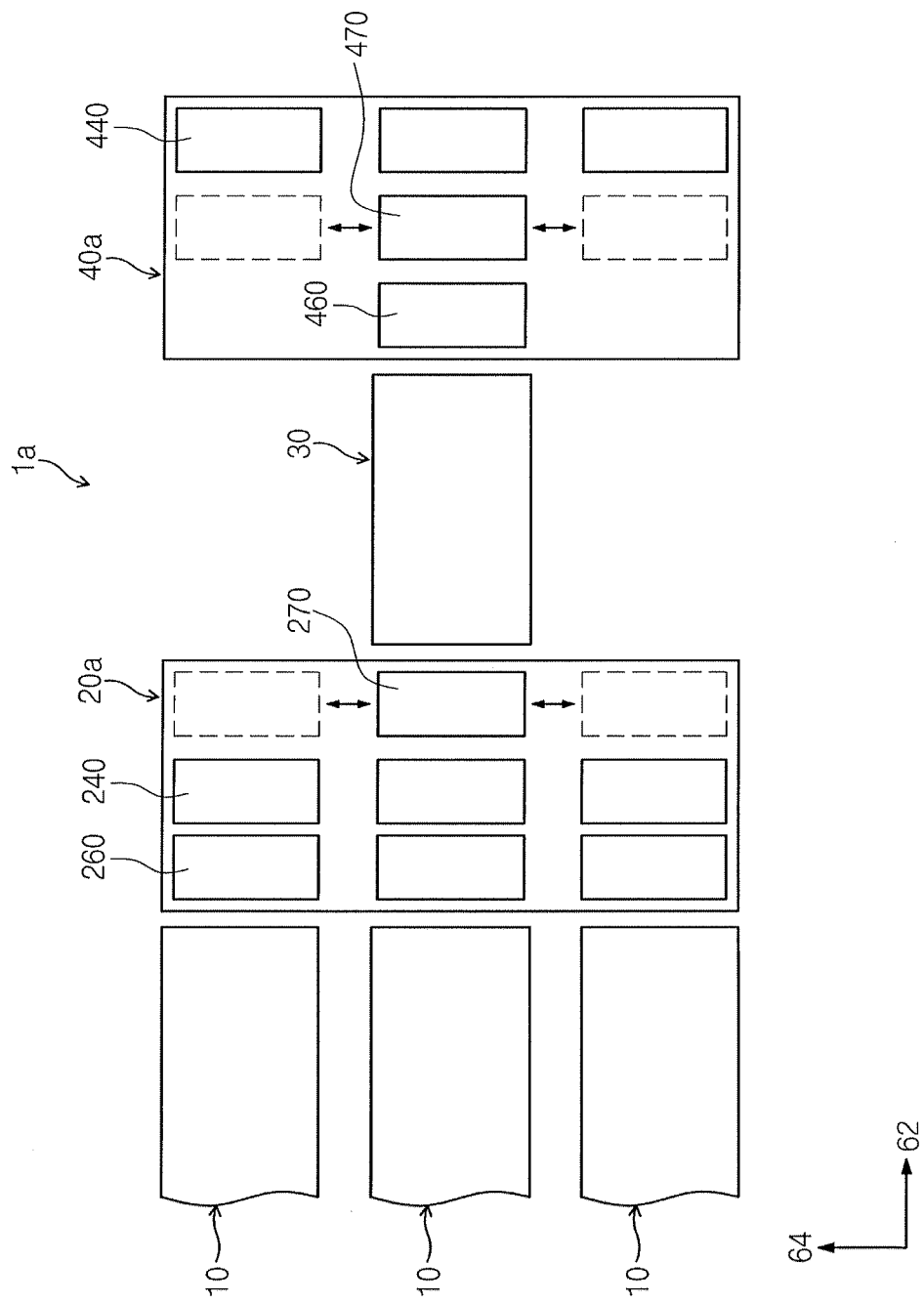
FIGS. 27 to 29 are schematic views illustrating a packaging apparatus according to embodiments of the present general inventive concept.

FIG. 27 illustrates a package apparatus 1a according to an embodiment of the present general inventive concept. As described above, since a heating unit 30 performs a reflow process using an induction heating method, a time or period taken to perform the reflow process on a first number of processing objects may be short compared with a time or period taken to store a second number of processing objects in the first treating unit 10. The package apparatus 1a includes a plurality of the first treating units 10, an input storage unit 20a, a heating unit 30, an output storage unit 40a and a moving unit 50. The first treating unit 10, the heating unit 30 and the moving unit 50 have the same structure as corresponding ones of the first treating unit 10, the heating unit 30 and the moving unit 50. The input storage unit 20a includes magazines 220, a plurality of input ports 260, a plurality of input stackers 240 and a divider 270. The input port 260 and the input stacker 240 corresponding to the number of the first treating unit 10 are provided. The input port 260 and the input stacker 240 have the same structure as respective the input port 260 and the input stacker 240 in FIG. 1. The input stacker 240 may be provided so that the input stacker 240 is moved to a third direction 66. The divider 270 is disposed between the input stackers 240 and the heating unit 30. The magazines 220 in each of the input stackers 240 are transferred to the divider 270, and the divider 270 moves the magazines 220 to a position facing the an entrance 321a of the heating room 360 of the heating unit 30. The divider 270 has a top surface on which the magazine 220 is disposed and is linearly moved along a second direction 64 by a divider mover (not illustrated). A pusher (not illustrated) may be provided to a region which is disposed to be adjacent to the input stacker 240 and opposite to a region where the divider 270 is provided. The pusher may be provided to one side of each of the input stackers 240. The pusher has a structure similar to the pusher 268 provided to the input port 260. The pusher pushes the magazine 220 received to the receiving space of the input stacker 240 to a top surface of the input port 260.

When the first treating units 10 are disposed in the second direction 64, and the processing object are prepared and transferred in the first direction 62 along a transferring path of the corresponding first treating unit 10, the driver 270 can move in the second direction 64 to receive the processing objects from the corresponding first treating unit 10, that is, the driver 270 can move in the second direction 64 to receive the magazine with the processing objects from the corresponding first treating unit 10 and to transfer the received magazine to the heating unit 30.

The output storage unit 40a includes an output port 460, a divider 470, and output stackers 440. The divider 470 is disposed between the output port 460 and the output stackers 440. The output port 460 and each of the output stackers 440 have the same structure as the output port 460 and the output stacker 440 of the apparatus in FIG. 1. The divider 470 has the same structure as the divider 270 provided to the input storage unit 20. The magazine 420 in which all the processing objects 5 are received is moved from the output port 460 to the divider 470 by a pusher (not illustrated). A pusher (not illustrated) which pushes the magazine 420 disposed on the output stacker 440 to a receiving space of the output stacker 440 may be provided to the divider 470. The output storage unit 40a may include one output stacker 44o without the divider 470.

The divider 470 receives the processing object and/or magazine in the first direction 62 and moves in the second direction 64 to transfer the received processing object and/or magazine to corresponding output stackers disposed in the second direction 64.

According to the package apparatus 1a of FIG. 27, since a reflow process is performed applied to the processing objects 5 treated by a plurality of the first treating units 10 using one heating unit 30, an apparatus area is reduced and a productivity of the heating unit 30 is improved as compared with a case that the heating unit 30 is provided to each of the first treating units 10.

Figure 28:
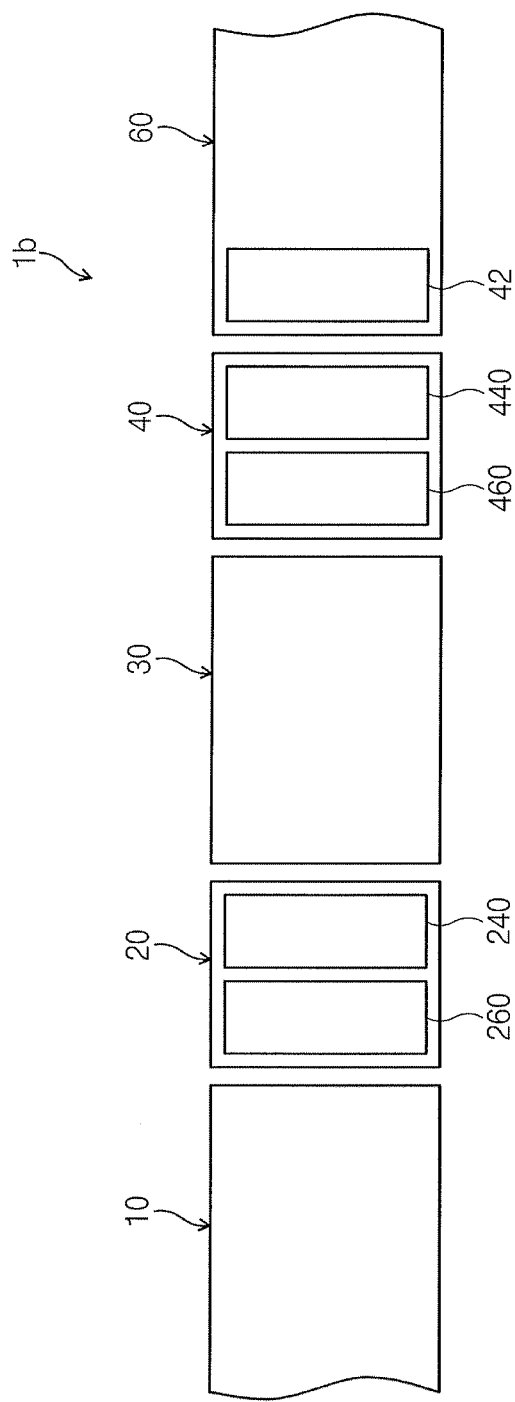

FIG. 28 illustrates a package apparatus 1b according to an embodiment of the present general inventive concept. The package apparatus 1b includes a first treating unit 10, an input storage unit 20, a heating unit 30, an output storage unit 40, a moving unit 50 and a second treating unit 60. The first treating unit 10, the input storage unit 20, the heating unit 30, the output storage unit 40 and a second treating unit 60 are sequentially disposed in a line when viewed from a top plan view. Each of the first treating unit 10, the input storage unit 20, the heating unit 30, the output storage unit 40 and the moving unit 50 has the same structure as the respective structures of the first treating unit 10, the input storage unit 20, the heating unit 30, the output storage unit 40 and the moving unit 50 of the package apparatus 1 in FIG. 1. The second treating unit 60 performs a subsequent process applied to a processing object 5 on which a reflow process is performed or completed. The second treating unit 60 includes an input port 42 which is adjacent to the output storage unit 40. A magazine 420 which is received in an output stacker 440 is transferred to the input port 42. A pusher (not illustrated) pushing the magazine 420 to the input port 42 may be provided to a region which is disposed to be adjacent to the output stacker 440 and opposite to the input port 42 provided to the second treating unit 60. A plurality of the first treating units 10 and a plurality of the second treating unit 20 may be provided. A divider may also be provided to the input storage unit 20 and the output storage unit 40.

According to an embodiment, the first treating unit 10 includes the ball attach unit described above and the processing objects 5 are semiconductor chips 54 on which solder balls are attached. The second treating unit 60 may be a singulation unit separate a plurality of the semiconductor chips 54 that are the processing objects 5 treated in the heating unit 30.

Figure 29:
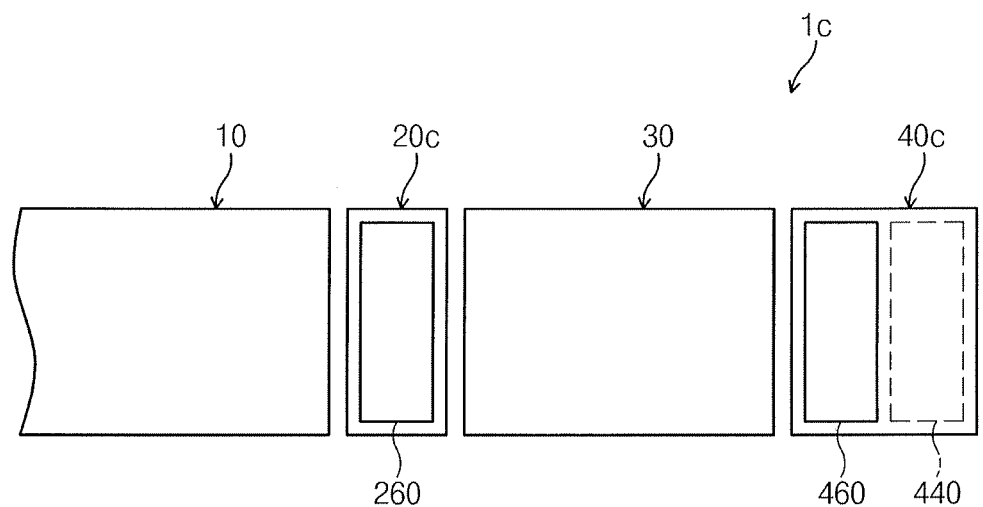

FIG. 29 illustrates a package apparatus 1c according to an embodiment of the present general inventive concept. The package apparatus 1c includes a first treating unit 10, an input storage unit 20c, a heating unit 30, an output storage unit 40c and a moving unit 50. The first treating unit 10, the input storage unit 20c, the heating unit 30, the output storage unit 40c and a second treating unit 60 are sequentially disposed in a line when viewed from a top plan view. Each of the first treating unit 10, the heating unit 30 and the moving unit 50 has the same structure as the respective structures of the first treating unit 10, the heating unit 30 and the moving unit 50 of the package apparatus 1 in FIG. 1. The input storage unit 20c includes a magazine 220 and an input port 260. An input stacker 240 is not provided to the input storage unit 20c. Thus, according to the present embodiment, when all the processing objects 5 are received to the magazine 220, the magazine 220 may be transferred to the heating unit 30 or the processing objects 5 in the magazine 220 may be transferred to the heating unit 30. The output storage unit 40c includes a magazine 420 and an output port 460. An output stacker 440 may be provided to the output storage unit 40c to store the magazines 420.

Figure 30:
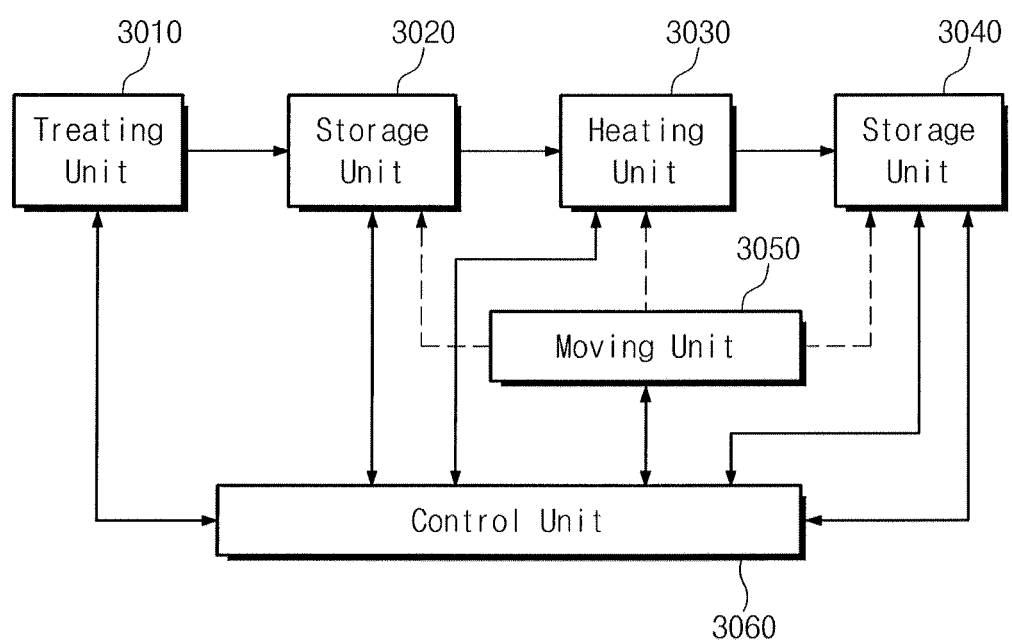
FIG. 30 is a block diagram illustrating an apparatus to manufacture one or more semiconductor chips or one or more semiconductor chip packages.

FIG. 30 is a block diagram illustrating an apparatus 3000 to manufacture one or more semiconductor chips or one or more semiconductor chip packages. The apparatus 1 of FIG. 1 can be used in the apparatus 3000 of FIG. 30 to manufacture the one or more semiconductor chips or one or more semiconductor chip packages by processing one or more processing objects. The apparatus 3000 includes a first treating unit 3010, a first storage unit 3020, a heating unit 3030, a second storage unit 3040, a moving unit 3050, and a control unit 3060. The first treating unit 3010, the first storage unit 3020, the heating unit 3030, the second storage unit 3040, and the moving unit 305 may be similar to the first treating unit 10, the input storage unit 20, the heating unit 30, the output storage unit 40, and the moving unit 50 of FIGS. 1-29. Therefore, detailed descriptions will be omitted. The moving unit 3050 can move or transfer the processing objects and/or magazines from the first storage unit 3020 to the second storage unit 3040 through the heating unit 3030. Additional moving units, such as stacker moving unit 280, the pusher 268, the vertical driver 266, and/or divider s 270 and 470, can be disposed to move or transfer the processing objects and/or magazines within each unit or between the adjacent units as described above with respect to the apparatus of FIGS. 1-29.

The control unit 3060 may be similar to the control unit 401 of FIG. 4. The control unit 3060 controls the first treating unit 3010, the first storage unit 3020, the heating unit 3030, the second storage unit 3040, the moving unit 3050, and the additional moving units according to signals of sensors thereof, to prepare the processing objects, to store (load) the processing objects into the corresponding magazines, to transfer the processing objects and/or magazines to the heating unit 3030 to perform the heating process, such as the reflow process, to transfer and store (load) the processing objects and/or the magazines in the second storage unit 204, and to control the transfer of the processing objects and/or the magazines according to timing of each process. The control unit 3060 can also controls the heating members 340, 340a, 340b, 340b' of the heating unit 3030 to provide a relative movement of the heating members with respect to the processing objects. The control unit 3060 can also control the coil to heat the processing objects in timely manner and to control temperature of the heating chamber or the solder balls.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An in-line package apparatus, comprising:
a first treating unit to treat one or more processing objects;
a heating unit including a heating member to heat the one or more processing objects using an induction heating method so as to perform a reflow process of a solder ball of the one or more processing objects treated in the first treating unit, the heating member including a coil and a power supply to apply an alternating current to the coil;
an input storage unit disposed between the first treating unit and the heating unit to store the one or more processing objects treated in the first treating unit; and
a moving unit to transfer the one or more processing objects stored in the input storage unit to the heating unit,
wherein the input storage unit comprises:
one or more magazines having slots formed therein to receive the one or more processing objects to be stacked and separated from each other;
an input port disposed to be adjacent to the first treating unit to support the one or more magazines; and
an input stacker disposed between the input port and the heating unit and
providing a plurality of spaces into which the one or more magazines are received, and
wherein the first treating unit, the heating unit, and the input storage unit are arranged sequentially in a straight line.

2. The in-line package apparatus of claim 1, wherein:
the input port comprises a supporting plate on which a magazine among the one or more magazines is put, the supporting plate being able to move up and down; and
the input storage unit further comprises a pusher which pushes the magazine placed on the supporting plate to a space provided to the input stacker, and a stacker moving member which horizontally and vertically moves the input stacker.

3. The in-line package apparatus of claim 1, wherein the moving unit comprises:
a pair of rails extending from positions proximate to the input stacker to positions past a region heated by the heating member, the rails separated from one another; and
a moving member to remove the one or more processing objects stored in the one or more magazines in the input stacker from the one or more magazines, and to move the one or more processing objects along the rails.

4. The in-line package apparatus of claim 3, wherein the rails respectively define a slot with a slit shape extending along a lengthwise direction of the rails, the slots in which edge regions of the one or more processing objects are inserted.

5. The in-line package apparatus of claim 4, wherein the rails respectively define a plurality of slots with slit shapes, the slots vertically separated from one another.

6. The in-line package apparatus of claim 1, wherein the moving unit comprises:

a pair of rails extending from positions proximate to the input stacker to positions past a region heated by the heating member, the rails separated from one another; and a moving member to move the one or more magazines in the input stacker along the rails.

7. The in-line package apparatus of claim 6, wherein:
the one or more magazines comprises guide protrusions projecting outward therefrom; and
the rails respectively define a slot with a slit shape along lengths of the rails, the guide protrusions inserting in the slots.

8. The in-line package apparatus of claim 6, wherein the one or more magazines is of a non-metal material.

9. The in-line package apparatus of claim 3, wherein the moving member comprises:
a moving bar movably provided horizontally in the heating unit;
an inserting finger coupled to the moving bar to be capable of moving vertically with respect to the moving bar, to remove one or more processing objects from within one or more magazines; and
a withdrawing finger coupled to the moving bar to be capable of moving vertically with respect to the moving bar and separated a predetermined distance from the inserting finger, to withdraw one or more processing objects that have been heated from the heating unit.

10. The in-line package apparatus of claim 1, wherein:
the moving unit comprises a plurality of moving units uniformly arranged in a horizontal direction, each of the moving units comprises:
a pair of rails extending from positions proximate to the input stacker to positions past a region heated by the heating member, the rails separated from one another, and
a moving member to remove the one or more processing objects stored in the one or more magazines in the input stacker from the one or more magazines, and to move the one or more processing objects along the rails; and
the heating member is provided corresponding to the respective rails and in plural.

11. The in-line package apparatus of claim 1, wherein:
the moving unit comprises a plurality of moving units uniformly arranged in a horizontal direction, each of the moving units comprises:
a pair of rails extending from positions proximate to the input storage unit to positions past a region heated by the heating member in the heating unit, the rails separated from one another, and
a moving member to remove the one or more processing objects stored in the one or magazines in the input storage unit from the one or more magazines, and to move the one or more processing objects along the rails; and
the heating member is disposed to intersect all the pairs of rails that are respectively provided in each of the moving units, to simultaneously heat a plurality of one or more processing objects on the rails.

12. The in-line package apparatus of claim 1, wherein:
the moving unit comprises a plurality of moving units uniformly arranged in a horizontal direction, each of the moving units comprises:

a pair of rails extending from positions proximate to the input storage unit to positions past a region heated by the heating member in the heating unit, the rails separated from one another, and
a moving member to remove the one or more processing objects stored in the one or more magazines in the input storage unit from the one or more magazines, and to move the one or more processing objects along the rails; and
the heating member is provided to be capable of moving between the pair of rails.

13. The in-line package apparatus of claim 1, wherein the heating member further comprises a rotating member to rotate the coil or the processing object.

14. The in-line package apparatus of claim 13, wherein the rotating member rotates the coil or the processing object on planes that the coil or processing object is supplied.

15. The in-line package apparatus of claim 13, wherein the rotating member rotates the coil or the processing object, such that an angle between the coil and the processing object is varied.

16. The in-line package apparatus of claim 1, wherein the coil fixedly installed at an angle with respect to the processing object.

17. The in-line package apparatus of claim 1, further comprising:
an infrared camera to capture an image of the processing object heated by the heating member.

18. The in-line package apparatus of claim 3, further comprising:
a chamber which the rails and the heating member are provided,
wherein the chamber is of a metal material for electromagnetic interference (EMI) shielding.

19. The in-line package apparatus of claim 1, wherein:
the first treating unit is provided in plurality and the input storage unit is provided in plurality corresponding to each of the first treating units; and
the input storage unit further comprises a divider that is disposed between the input stackers and the heating unit and moves the one or more magazines stored in the input stacker to the heating unit.

20. The in-line package apparatus of claim 1, wherein the first treating unit comprises a chip mounter unit to mount a semiconductor chip with a solder ball on a printed circuit board and the processing object is the printed circuit board on which the semiconductor chip is mounted.

21. The in-line package apparatus of claim 1, wherein the first treating unit comprises a ball attach unit to attach a solder ball to the semiconductor chip and the processing object is the semiconductor chip to which the solder ball is attached.

22. The in-line package apparatus of claim 21, wherein:
the first treating unit comprises a ball attach unit to attach a solder ball to the semiconductor chip and a plurality of the semiconductor chip is provided to the processing object,
the in-line package apparatus further comprises:
a singulation unit to separate individual semiconductor chips from the one or more processing objects; and
an output storage unit disposed between the heating unit and the singulation unit to store the processing object heated in the heating unit.

* * * * *